United States Patent
Yamazaki et al.

(10) Patent No.: US 6,781,162 B2
(45) Date of Patent: Aug. 24, 2004

(54) LIGHT EMITTING DEVICE AND METHOD OF MANUFACTURING THE SAME

(75) Inventors: Shunpei Yamazaki, Tokyo (JP);
Masaaki Hiroki, Kanagawa (JP);
Masakazu Murakami, Kanagawa (JP);
Hideaki Kuwabara, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/349,738

(22) Filed: Jan. 23, 2003

(65) Prior Publication Data

US 2003/0137325 A1 Jul. 24, 2003

(30) Foreign Application Priority Data

Jan. 24, 2002 (JP) ........................................ 2002-014902

(51) Int. Cl.[7] .......................................... H01L 31/0328
(52) U.S. Cl. ........................ 257/184; 257/187; 257/202; 257/291; 257/433; 257/461; 257/929
(58) Field of Search ................................ 257/184, 187, 257/202, 291, 433, 461, 929; 438/149–166

(56) References Cited

U.S. PATENT DOCUMENTS

| | | | |
|---|---|---|---|
| 5,929,474 A | * | 7/1999 | Huang et al. ................ 257/292 |
| 6,420,834 B2 | | 7/2002 | Yamazaki et al. |
| 6,489,631 B2 | * | 12/2002 | Young et al. ................ 257/59 |
| 2001/0043046 A1 | | 11/2001 | Fukunaga |
| 2002/0158835 A1 | | 10/2002 | Kobayashi et al. |

FOREIGN PATENT DOCUMENTS

| | | |
|---|---|---|
| JP | 10-189252 | 7/1998 |
| JP | 2001-254169 | 9/2001 |
| JP | 2001-345179 | 12/2001 |
| JP | 2002-318553 | 10/2002 |
| JP | 2002-318556 | 10/2002 |

* cited by examiner

*Primary Examiner*—Long Pham
*Assistant Examiner*—Wai-Sing Louie
(74) *Attorney, Agent, or Firm*—Fish & Richardson P.C.

(57) ABSTRACT

To provide a light emitting device high in reliability with a pixel portion having high definition with a large screen. According to a light emitting device of the present invention, on an insulator (24) provided between pixel electrodes, an auxiliary electrode (21) made of a metal film is formed, whereby a conductive layer (20) made of a transparent conductive film in contact with the auxiliary electrode can be made low in resistance and thin. Also, the auxiliary electrode (21) is used to achieve connection with an electrode on a lower layer, whereby the electrode can be led out with the transparent conductive film formed on an EL layer. Further, a protective film (32) made of a film containing hydrogen and a silicon nitride film which are laminated is formed, whereby high reliability can be achieved.

18 Claims, 14 Drawing Sheets

FIG. 1A  sectional view of A-A'
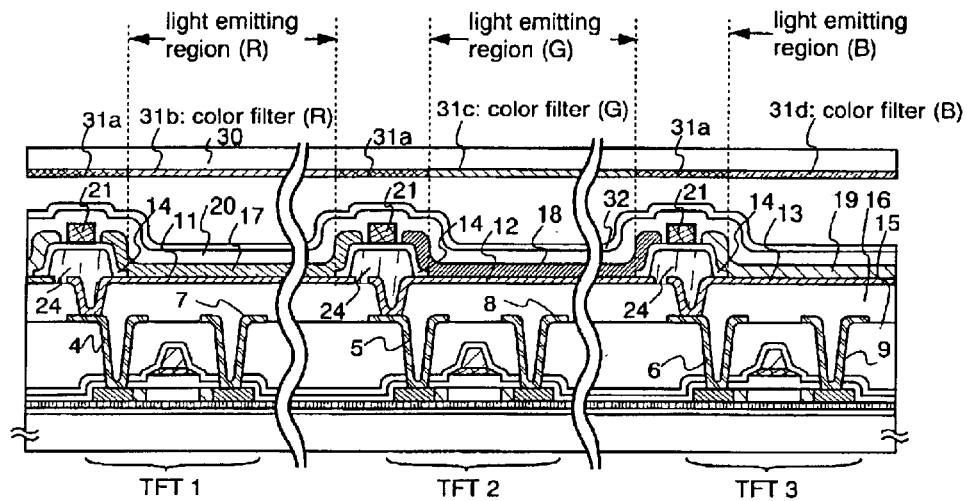
FIG. 1B  sectional view of B-B'
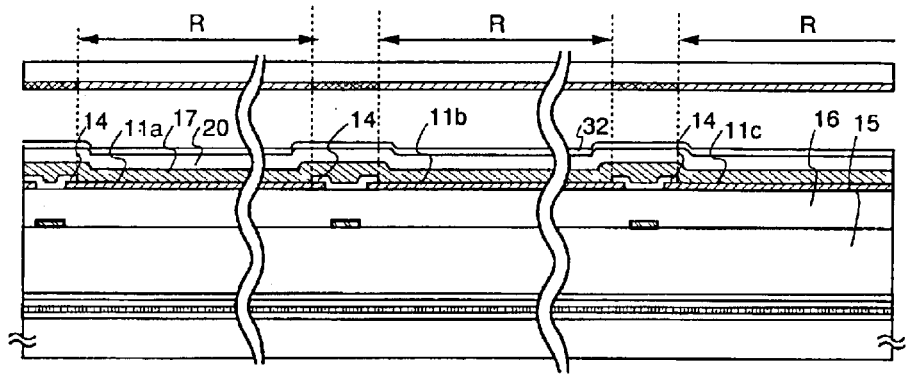
FIG. 1C  sectional view of C-C'
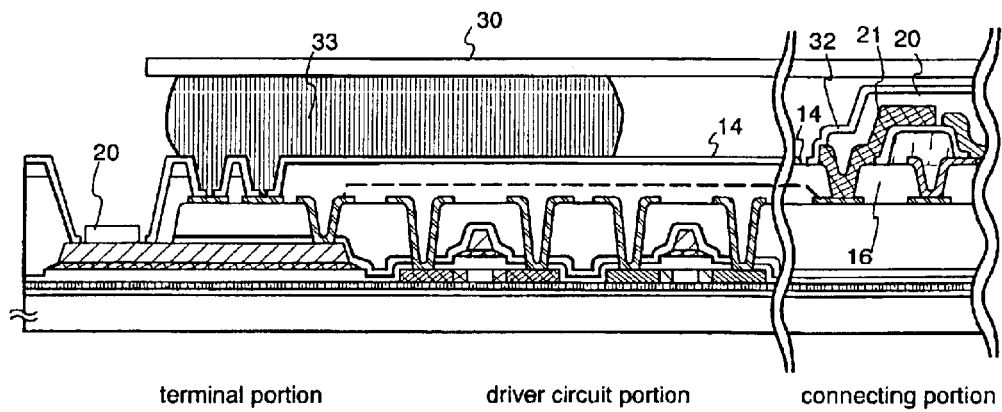
terminal portion        driver circuit portion        connecting portion terminal portion | driver circuit portion | connecting portion terminal portion | driver circuit portion | connecting portion terminal portion | driver circuit portion | connecting portion terminal portion | driver circuit portion | connecting portion

- 204: protective film (SiN film)
- 203: DLC film containing hydrogen
- 202: anode (or cathode)
- 201: EL layer
- 200: cathode (or anode)

- 304: protective film (SiN film)
- 303: SiN film containing hydrogen
- 302: anode (or cathode)
- 301: EL layer
- 300: cathode (or anode)

FIG. 6A sectional view of A-A'
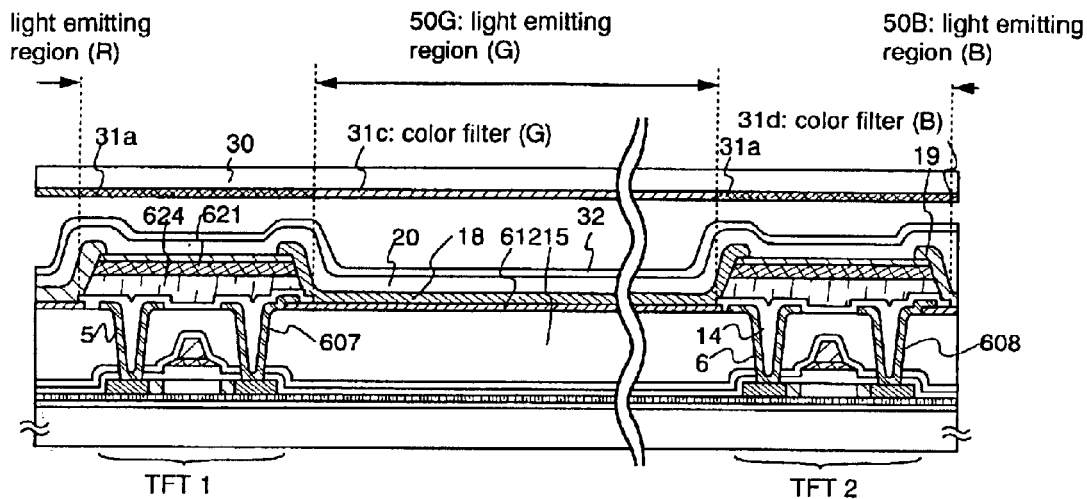
FIG. 6B sectional view of B-B'
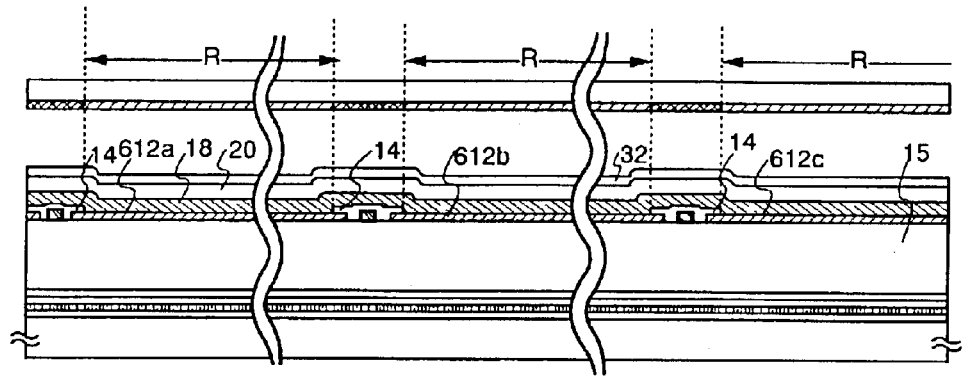
FIG. 6C sectional view of C-C'
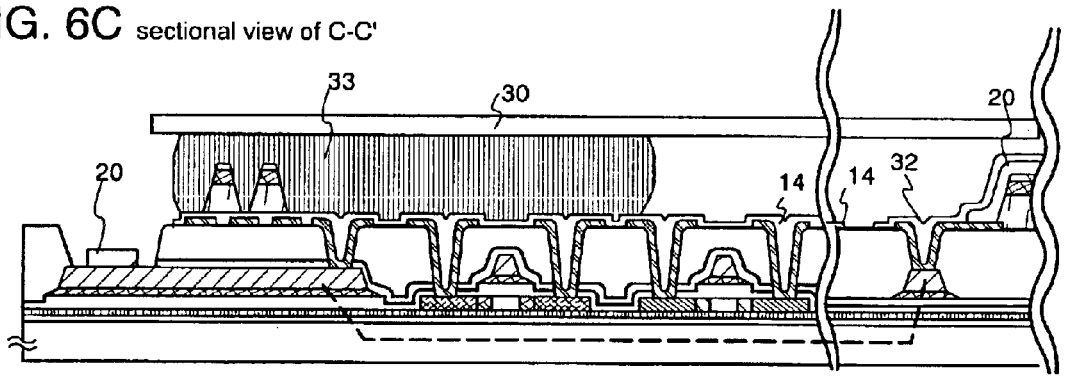

cross section of connecting portion (cut along Y direction)

cross section of connecting portion (cut along Y direction)

cross section of connecting portion (cut along X direction)

FIG. 9A sectional view of A-A'
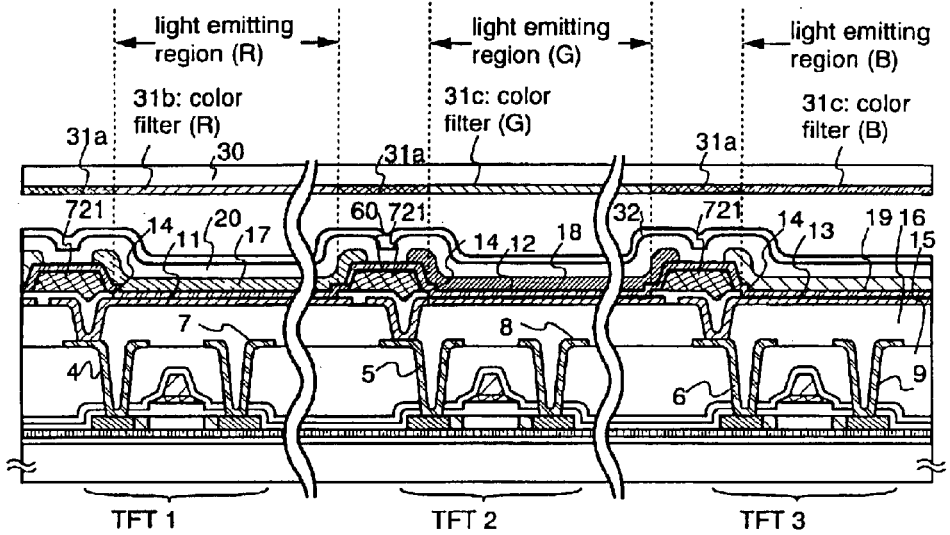
FIG. 9B sectional view of B-B'
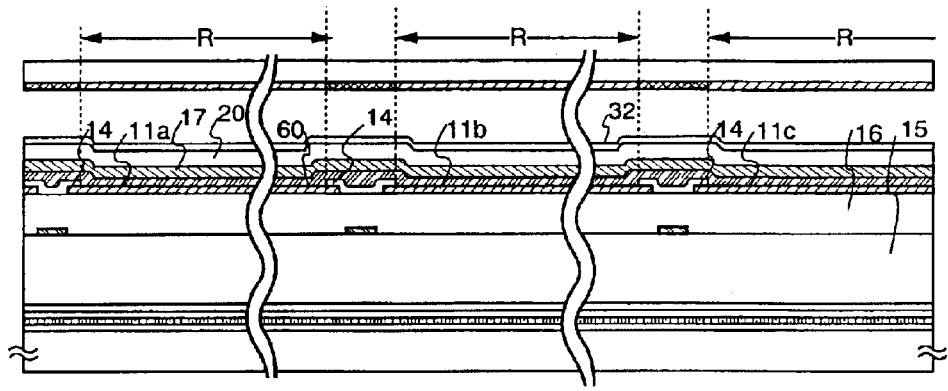
FIG. 9C sectional view of C-C'
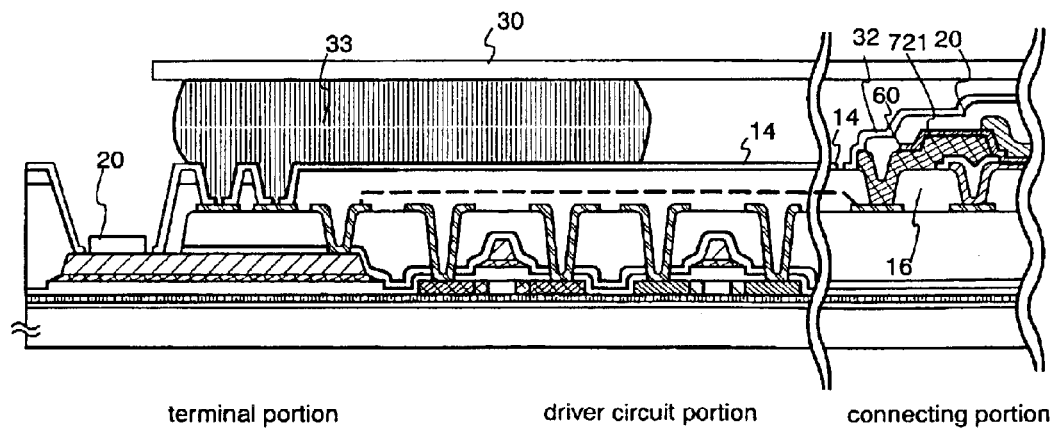

FIG. 10A sectional view of A-A'
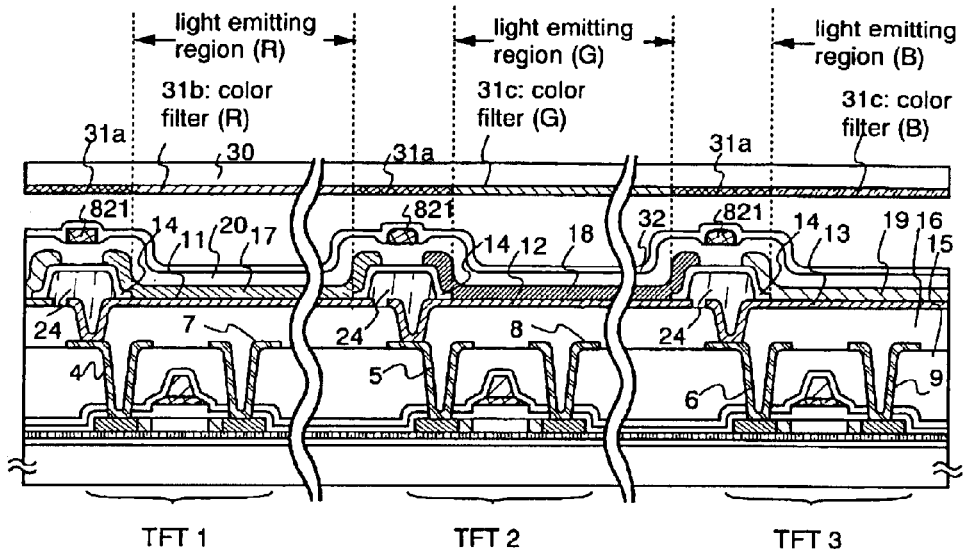
FIG. 10B sectional view of B-B'
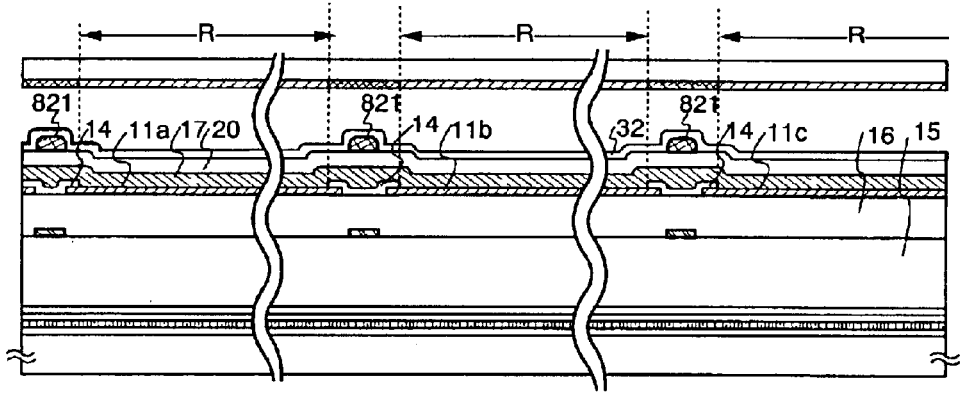
FIG. 10C sectional view of C-C'
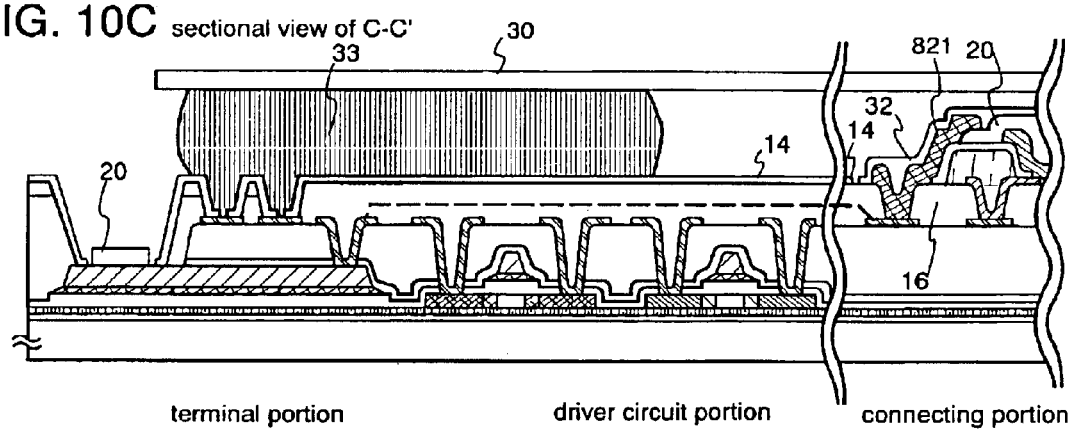

LIGHT EMITTING DEVICE AND METHOD OF MANUFACTURING THE SAME

BACKGROUND OF THE INVENTION

1. Field of the Invention

The present invention relates to a semiconductor device and, particularly, to a light emitting device having an organic light emitting element formed over a substrate having an insulating surface and a manufacturing method therefor. The present invention also relates to a module in which an IC etc. including a controller is mounted on a panel having the organic light emitting element. Note that, in this specification, the panel and the module which have the organic light emitting element are collectively referred to as a light emitting device. Further, the present invention relates to an apparatus for manufacturing the light emitting device.

Note that, in this specification, the term semiconductor device refers to the devices in general which can function by utilizing semiconductor characteristics. The light emitting device, an electro-optic device, a semiconductor circuit, and an electronic device are all included in the category of the semiconductor device.

2. Description of the Related Art

Techniques of forming TFTs (thin film transistors) on substrates have been progressing greatly in recent years, and developments in their application to active matrix display devices is advancing. In particular, TFTs that use polysilicon films have a higher electric field effect mobility (also referred to as mobility) than TFTs that use conventional amorphous silicon films, and therefore high speed operation is possible. Developments in performing control of pixels by forming driver circuits made from TFTs that use polysilicon films over a substrate on which the pixels are formed have therefore been flourishing. It has been expected that various advantages can be obtained by using active matrix display devices in which pixels and driver circuits are mounted on the same substrate, such as reductions in manufacturing cost, miniaturization of the display device, increases in yield, and increases in throughput.

Furthermore, research on active matrix light emitting devices using organic light emitting elements as self light emitting elements (hereinafter referred to simply as light emitting devices) has become more active. The light emitting devices are also referred to as organic EL displays (OELDs) and organic light emitting diodes (OLEDs).

TFT switching elements (hereinafter referred to as switching elements) are formed for each pixel in active matrix light emitting devices, and driver elements for performing electric current control using the switching TFTs (hereinafter referred to as electric current control TFTs) are operated, thus making EL layers (strictly speaking, light emitting layers) emit light. For example, a light emitting device disclosed in JP 10-189252 is known.

Organic light emitting elements are self light emitting, and therefore have high visibility. Backlights, necessary for liquid crystal display devices (LCDs), are not required for organic light emitting elements, which are optimal for making display devices thinner and have no limitations in viewing angle. Light emitting devices using organic light emitting elements are consequently being focused upon as substitutes for CRTs and LCDs.

Note that EL elements have a layer containing an organic compound in which luminescence develops by the addition of an electric field (Electro Luminescence) (hereinafter referred to as EL layer), an anode, and a cathode. There is light emission when returning to a base state from a singlet excitation state (fluorescence), and light emission when returning to a base state from a triplet excitation state (phosphorescence) in the organic compound layer, and it is possible to apply both types of light emission to light emitting devices manufactured by the manufacturing apparatus and film formation method of the present invention.

EL elements have a structure in which an EL layer is sandwiched between a pair of electrodes, and the EL layer normally has a laminate structure. A "hole transporting layer/light emitting layer/electron transporting layer" laminate structure can be given as a typical example. This structure has extremely high light emitting efficiency, and at present almost all light emitting devices undergoing research and development employ this structure.

Further, a structure in which: a hole injecting layer, a hole transporting layer, a light emitting layer, and an electron transporting layer are laminated in order on an anode; or a hole injecting layer, a hole transporting layer, a light emitting layer, an electron transporting layer, and an electron injecting layer are laminated in order on an anode may also be used. Fluorescent pigments and the like may also be doped into the light emitting layers. Further, all of the layers may be formed by using low molecular weight materials, and all of the layers may be formed by using high molecular weight materials.

The conventional active matrix type light emitting device is composed of a light emitting element in which an electrode electrically connected with TFT on the substrate is formed as an anode, then the organic compound layer was formed on the anode. Light generated at the organic compound layer is radiated from the anode that is a transparent electrode to TFT.

However, in this structure, the problem has arisen when the resolution is intended to be risen that an aperture ratio is limited due to an arrangement of TFT and wirings in the pixel unit.

SUMMARY OF THE INVENTION

According to the present invention, manufactured is an active matrix light emitting device having the light emitting element with a structure in which an electrode on the TFT side electrically connected to the TFT on the substrate is formed as a cathode, on which an organic compound layer and an anode as a transparent electrode are formed in the stated order (hereinafter, referred to as upper surface emission structure). Alternatively, manufactured is an active matrix light emitting device having the light emitting element with a structure in which an electrode on the TFT side electrically connected to the TFT on the substrate is formed as an anode, on which an organic compound layer and a cathode as a transparent electrode are formed in the stated order (hereinafter, also referred to as upper surface emission structure).

In the above-mentioned respective structures, there arises a problem concerning a higher film resistance of a transparent electrode. In particular, when a film thickness of the transparent electrode is reduced, the film resistance further increases. If the film resistance of the transparent electrode serving as an anode or a cathode is increased, there arises a problem in that a potential distribution in the surface becomes nonuniform due to voltage drop, which involves variations in luminance of the light emitting element. Accordingly, an object of the present invention is to provide a light emitting device having a structure useful in decreasing the film resistance of the transparent electrode of the light emitting element and a manufacturing method therefor and further to provide an electronic device using the above light emitting device as a display portion.

In addition, another object of the present invention is to increase reliability in the light emitting element and the light emitting device.

According to the present invention, in manufacturing the light emitting element formed over the substrate, a conductive film is formed on an insulator arranged between pixel electrodes prior to formation of an organic compound layer for the purpose of suppressing the film resistance of the transparent electrode.

Further, the present invention is characterized in that a lead wiring is formed using the above conductive film to achieve connection with other wirings on a lower layer as well.

According to a structure of the invention disclosed in this specification, there is provided a light emitting device, including:
  a pixel portion having a plurality of light emitting elements each including: a first electrode; an organic compound layer formed on the first electrode in contact therewith; and a second electrode formed on the organic compound layer in contact therewith;
  a driver circuit; and
  a terminal portion,
  the device being characterized in that:
    in the pixel portion, end portions of the first electrode connected to a thin film transistor are covered with an insulator, a third electrode made of a conductive material is formed on the insulator, the organic compound layer is formed on the insulator and the first electrode, and the second electrode is formed on the organic compound layer and the third electrode in contact therewith; and
    a portion where a wiring made of a material identical to that of the third electrode or that of the second electrode is connected with a wiring extended from a terminal is formed between the terminal portion and the pixel portion.

In the above-mentioned structure, the third electrode may have a pattern shape identical to that of the insulator. In this case, it is formed using a mask identical to that of the insulator.

Alternatively, in the above-mentioned structure, the third electrode may have a pattern shape different from that of the insulator. In this case, after patterning the insulator, a film made of a conductive material is formed to form the third electrode using a mask different from that used for patterning the insulator.

Also, according to another structure of the present invention, in manufacturing a light emitting element formed over a substrate, a conductive film is formed on an insulator arranged between pixel electrodes prior to formation of the organic compound layer, and after the organic compound layer and a transparent electrode are formed, an electrode made of a material high in conductivity is formed on the transparent electrode to realize low film resistance of the transparent electrode. Note that, the electrode formed on the transparent electrode is not formed in a portion serving as a light emitting region. Further, the present invention is also characterized in that a lead wiring is formed using the conductive film to achieve connection with other wirings formed on a lower layer.

According to another structure of the invention disclosed in this specification, there is provided the light emitting device, including:
  a pixel portion having a plurality of light emitting elements each including: a first electrode; an organic compound layer formed on the first electrode in contact therewith; and a second electrode formed on the organic compound layer in contact therewith;
  a driver circuit; and
  a terminal portion,
  the device being characterized in that;
    in the pixel portion, end portions of the first electrode connected to a thin film transistor are covered with an insulator, the organic compound layer is formed on a part of the insulator and the first electrode, the second electrode is formed on the organic compound layer in contact therewith, and a third electrode made of a conductive material is formed on a region of the second electrode which is not overlapped with the first electrode in contact therewith; and
    a portion where a wiring made of a material identical to that of the third electrode or that of the second electrode is connected with a wiring extended from a terminal is formed between the terminal portion and the pixel portion.

Also, in the above-mentioned structures, the light emitting device is characterized in that the second electrode is a cathode or an anode of the light emitting element.

Also, in the above-mentioned structures, the light emitting device is characterized in that the third electrode is made of a material having electric resistance lower than that constituting the second electrode and is made of poly-Si doped with an impurity element imparting a conductivity type, an element selected from the group consisting of W, $WSi_x$, Al, Ti, Mo, Cu, Ta, Cr, and Mo, a film mainly containing an alloy material or a compound material mainly containing the element, or a laminate film thereof. For example, it is preferable that the third electrode is an electrode made of a laminate having a nitride layer or a fluoride layer as an uppermost layer.

Also, in the above-mentioned structures, the light emitting device is characterized in that the first electrode is a cathode or an anode of the light emitting element. For example, when the second electrode is a cathode, the first electrode serves as an anode, whereas when the second electrode is an anode, the first electrode serves as a cathode.

Also, in the above-mentioned structures, the light emitting device is characterized in that the insulator is a barrier (also referred to as bank) made of organic resin covered with an inorganic insulating film or is an inorganic insulating film. Note that, the light emitting device is characterized in that the inorganic insulating film is an insulating film mainly containing silicon nitride with a film thickness of 10 to 100 nm.

Also in the light emitting device, there is a problem in that in a pixel emitting no light, an incident outside light (light outside the light emitting device) is reflected by the rear surface of the cathode (surface brought into contact with an light emitting layer) which acts as mirror and outside scenes are reflected in an observation surface (surface facing an observer side). In order to avoid the problem, the following is devised such that a circular polarization film is attached to the observation surface of the light emitting device to prevent the observation surface from reflecting the outside scenes. However, there arises a problem in that the circular polarization film is extremely expensive, which involves an increase in manufacturing cost.

Another object of the present invention is to prevent the light emitting device from acting as mirror without using the circular polarization film to accordingly provide an inexpensive light emitting device which attains low manufacturing cost thereof. Accordingly, the present invention is characterized by using an inexpensive color filter instead of using the circular polarization film. In the above-mentioned structure, it is preferable to provide a color filter corresponding to each pixel in the light emitting device in order to increase color purity. Also, a black portion (black organic resin) of the color filter may be arranged so as to overlap each portion between light emitting regions. Further, the black portion (black colored layer) of the color filter may be also arranged so as to overlap a portion where different organic compound layers are partially overlapped with each other.

Note that, the color filter is provided in an emission direction of an emitted light, i.e., provided between the light emitting element and the observer. For example, when the light is not allowed to pass through the substrate having formed the light emitting element thereon, the color filter may be attached to the sealing substrate. Alternatively, when the light is allowed to pass through the substrate having formed the light emitting element thereon, the color filter may be attached thereto. Thus, it is possible to dispense with the circular polarization film.

In addition, it is extremely effective that as an anode on a layer containing an organic compound, a transparent conductive film (typically, ITO or ZnO) is used, on which a protective film made of an inorganic insulating film is formed. The following is also effective: as a cathode containing an organic compound, a metal thin film (with a film thickness allowing a light to pass the film) made of Al, Ag, and Mg, or an alloy thereof (typically, AlLi) is used, on which the protective film made of the inorganic insulating film is formed.

Also, before the protective film made of the inorganic insulating film is formed, it is preferable that a film containing hydrogen, typically a thin film mainly containing carbon, or a silicon nitride film is formed by a plasma CVD method or a sputtering method. Also, the film containing hydrogen may be a laminate film consisting of the thin film mainly containing carbon and the silicon nitride film.

Further, according to another structure of the present invention, there is provided the light emitting device including a light emitting element over a substrate having an insulating surface, the light emitting element including an anode, a cathode, and an organic compound layer interposed between the anode and the cathode, characterized in that the light emitting element is covered with a film containing hydrogen.

If heat treatment is performed within a range of temperature to which the organic compound layer can be resistant and heat generated when the light emitting element emits the light is utilized, hydrogen can be diffused from the film containing hydrogen to terminate defects in the organic compound layer with hydrogen (termination). By terminating the defects in the organic compound layer with hydrogen, the light emitting device can be increased in its reliability. Also, when the film containing hydrogen is formed, hydrogen turned into a plasma can be used to terminate defects in the organic compound layer with hydrogen. The protective film formed so as to cover the film containing hydrogen also functions to block hydrogen diffused toward the protective film side and to efficiently diffuse hydrogen into the organic compound layer to terminate defects in the organic compound layer with hydrogen. Further, the film containing hydrogen can serve as the protective film for the light emitting element.

Further, the film containing hydrogen can serve as a buffer layer. When the silicon nitride film is formed in contact with the transparent conductive film by a sputtering method, there is a possibility that impurities (In, Sn, Zn, etc.) contained in the transparent conductive film are mixed into the silicon nitride film. However, by forming the film containing hydrogen as a buffer layer therebetween, it is also possible to prevent mixture of the impurities into the silicon nitride film. According to the above structure, the buffer layer is formed, so that the impurities (In, Sn, etc.) can be prevented from mixing therein from the transparent conductive film and a superior protective film having no impurities can be formed.

According to another structure of the present invention, there is provided the light emitting device including a light emitting element over a substrate having an insulating surface, the light emitting element including an anode, a cathode, and an organic compound layer interposed between the anode and the cathode, characterized in that the light emitting element is covered with a film containing hydrogen which is covered with a protective film made of an inorganic insulating film.

Also, a manufacturing method capable of realizing the above-mentioned structure is included in the present invention. According to a structure relating to a manufacturing method of the present invention, there is provided a manufacturing method for a light emitting device, characterized by including:

forming a TFT on an insulating surface;
forming a cathode electrically connected to the TFT;
forming an organic compound layer on the cathode; and
forming an anode on the organic compound layer and then forming a film containing hydrogen on the anode.

Also, according to another structure relating to the manufacturing method of the present invention, there is provided the manufacturing method for a light emitting device, characterized by including:

forming a TFT on an insulating surface;
forming an anode electrically connected to the TFT;
forming an organic compound layer on the anode; and
forming a cathode on the organic compound layer and then forming a film containing hydrogen on the cathode.

In the above-mentioned structures relating to the manufacturing method of the present invention, the method is characterized in that the film containing hydrogen is formed by a plasma CVD method or a sputtering method within a range of temperature to which the organic compound layer can be resistant, for example, a range from room temperature to 100° C. or less and that the film containing hydrogen is a thin film mainly containing carbon or a silicon nitride film.

In the above-mentioned structures relating to the manufacturing method of the present invention, the method is characterized in that a step of forming the organic compound layer is performed by an evaporation method, a coating method, an ion plating method, or an ink jet method.

In the above-mentioned structures relating to the manufacturing method of the present invention, the method is characterized in that a protective film made of an inorganic insulating film is formed on the film containing hydrogen.

In the above-mentioned structures relating to the manufacturing method of the present invention, the method is characterized in that when the film containing hydrogen is formed, a defect in the organic compound layer is terminated with hydrogen.

Also, in order to prevent deterioration due to moisture or oxygen, when the light emitting element is sealed with a sealing can or a sealing substrate, a space to be sealed may be filled with a hydrogen gas or with hydrogen and inert gas (rare gas or nitrogen).

According to another structure of the present invention, there is provided the light emitting device including a light emitting element over a substrate having an insulating surface, the light emitting element including an anode, a cathode, and an organic compound layer interposed between the anode and the cathode, characterized in that the light emitting element is sealed with a substrate having a light-transmissive property and a sealing member, and a sealed space contains hydrogen.

In the above-mentioned structure, the light emitting device is characterized in that the light emitting element is covered with the film containing hydrogen (thin film mainly containing carbon or silicon nitride film).

Also, with the above-mentioned structure, heat treatment is performed within a range of temperature to which the organic compound layer can be resistant and heat generated when the light emitting element emits the light is utilized, so that hydrogen can be diffused from the space containing hydrogen to terminate defects in the organic compound layer with hydrogen. By terminating defects in the organic compound layer with hydrogen, the light emitting device can be increased in its reliability.

Note that, in this specification, all the layers provided between the cathode and the anode are collectively referred to as an EL layer. Thus, the above-mentioned hole injection layer, hole transportation layer, light emitting layer, electron transportation layer, and electron injection layer are all included in the EL layer.

The present invention is characterized in that the thin film mainly containing carbon is a DLC (diamond like carbon) film having a thickness of 3 to 50 nm. The DLC film has an $SP^3$ bond as a bond between carbons in terms of short range order but has an amorphous structure in a macro level. The composition of the DLC film is carbon and hydrogen with the contents of 70 to 95 atoms % and 5 to 30 atoms %, respectively. Thus, the film is extremely hard and superior in an insulating property. Such a DLC film is characterized in that gas permeability with respect to moisture, oxygen, etc. is low. Also, it is known that the film has hardness of 15 to 25 GPa as a result of measurement by a microhardness meter.

The DLC film can be formed by a plasma CVD method (typically, RF plasma CVD method, microwave CVD method, electron cyclotron resonance (ECR) CVD method, or the like), a sputtering method, or the like. Any film formation method can be adopted to form the DLC film with good adhesiveness. The DLC film is formed with the substrate placed on the cathode. Also, when a negative bias is applied thereto and ion impact is utilized to some degree, a minute and hard film can be formed.

As a reaction gas used for film formation, a hydrogen gas and a hydrocarbon-based gas (e.g., $CH_4$, $C_2H_2$, $C_6H_6$, or the like) are used, which are ionized due to glow discharge, and ions are accelerated and abutted against a cathode to which a negative self-bias is applied to thereby form the film. Thus, a minute and smooth DLC film can be obtained.

Also, the DLC film is characterized by including a transparent or semi-transparent insulating film with respect to a visible light.

Further, in this specification, the term transparent with respect to the visible light means a state in which transmittance of the visible light is 80 to 100% and the term semi-transparent with respect to the visible light means a state in which transmittance of the visible light is 50 to 80%.

BRIEF DESCRIPTION OF THE DRAWINGS

In the accompanying drawings:

FIGS. 1A to 1C are sectional views in accordance with Embodiment Mode 1 of the present invention;

FIGS. 6A to 6C are sectional views in accordance with Embodiment Mode 3 of the present invention;

FIGS. 9A to 9C are sectional views in accordance with Embodiment Mode 4 of the present invention;

FIGS. 10A to 10C are sectional views in accordance with Embodiment Mode 5 of the present invention;

DETAILED DESCRIPTION OF THE PREFERRED EMBODIMENTS

Embodiment modes of the present invention will be described below.

[Embodiment Mode 1]

Figure 2:
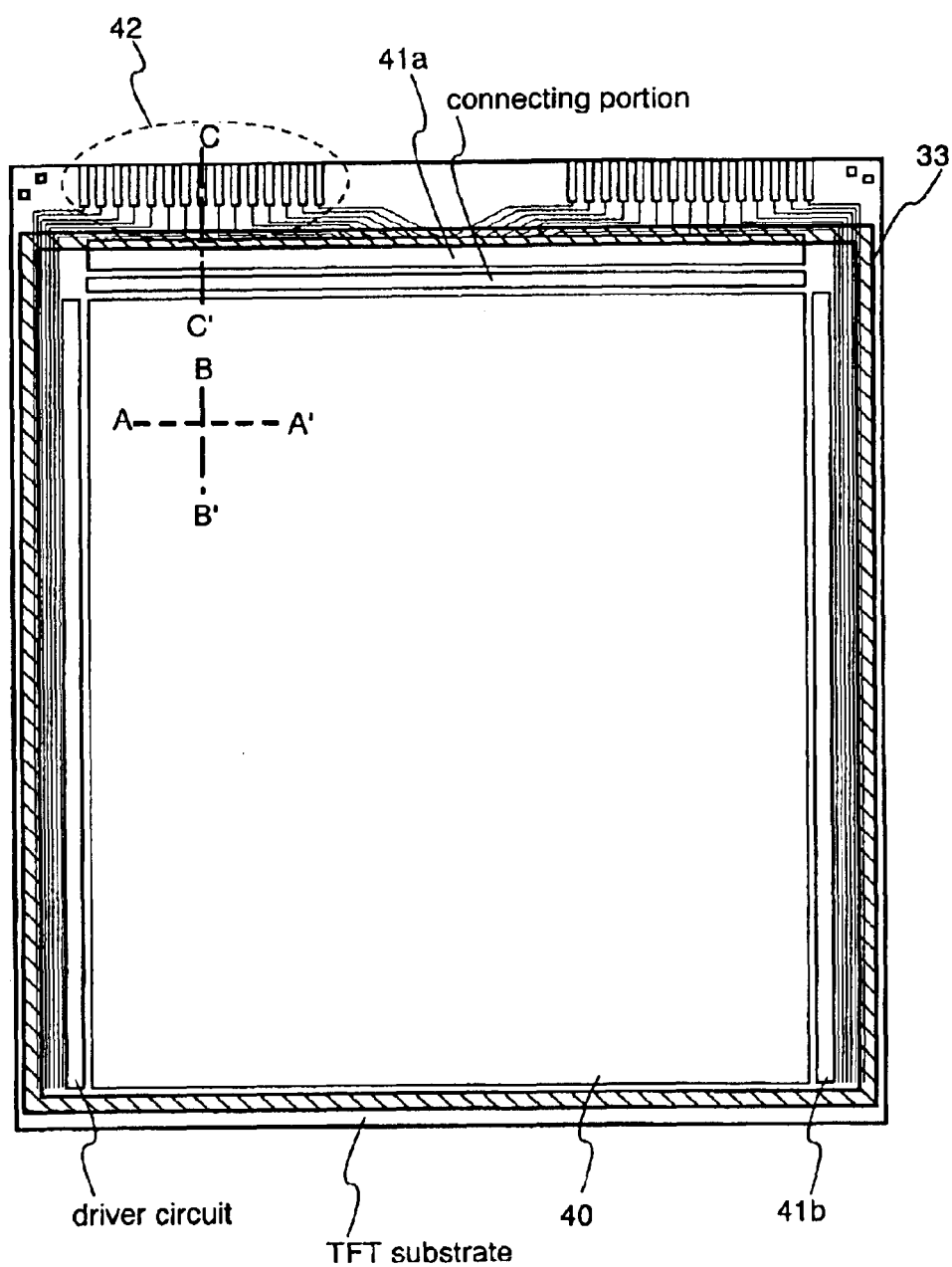
FIG. 2 is a top view in accordance with Embodiment Mode 1 of the present invention.

FIG. 2 is a top view of an EL module. In the figure, over a substrate (also referred to as TFT substrate) where a number of TFTs are provided, there are formed a pixel portion 40 used for display, driver circuits 41a and 41b for driving pixels of the pixel portion, a connecting portion for connecting an electrode formed on an EL layer and a lead wiring, and a terminal portion 42 to which an FPC is attached for connecting an external circuit therewith. Also, a substrate for sealing an EL element and a sealing member 33 are used to attain a sealed state. FIG. 1A is a sectional view taken along the dashed line A–A' of FIG. 2.

The pixels are arranged regularly in the direction of the dashed line A–A'. Here, an example of the pixels arranged in the order of R, G, and B in an X direction will be shown.

In FIG. 1A, a light emitting region (R) indicates a region for emitting a red light; a light emitting region (G), a region for emitting a green light; and a light emitting region (B), a region for emitting a blue light. These light emitting regions of three colors realize a light emitting display device capable of full color display.

Also, in FIG. 1A, a TFT 1 is an element for controlling a current flowing in an EL layer 17 emitting a red light and reference numerals 4 and 7 denote source or drain electrodes. Further, a TFT 2 is an element for controlling a current flowing in an EL layer 18 emitting a green light and reference numerals 5 and 8 denote source or drain electrodes. A TFT 3 is an element for controlling a current flowing in an EL layer 19 emitting a blue light and reference numerals 6 and 9 denote source or drain electrodes. Reference numerals 15 and 16 denote interlayer insulating films formed of an organic insulating material or an inorganic insulating film material.

Reference numerals 11 to 13 each denote an anode (or a cathode) of the organic light emitting element and 20 denotes a cathode (or an anode) of the organic light emitting element. In this example, the cathode 20 is made of a laminate film consisting of a thin metal layer (typically, an alloy of MgAg, MgIn, AlLi, or the like) and a transparent conductive film (an alloy of an indium oxide and a tin oxide (ITO), an alloy of an indium oxide and a zinc oxide ($In_2O_3$—ZnO), a zinc oxide (ZnO), and the like), through which light from the respective light emitting elements passes. Note that, the transparent conductive film is provided not to function as a cathode but to decrease the electric resistance. As an anode, the following may be used: a material having a high work function, specifically, platinum (Pt), chromium (Cr), tungsten (W), or a nickel (Ni); a transparent conductive film (ITO, ZnO, or the like); and a laminate thereof.

Also, organic insulators 24 (also referred to as barrier or bank) cover both ends of the anodes (or cathodes) 11 to 13 and portions therebetween. Further, the organic insulators 24 are covered with inorganic insulating films 14. An organic compound layer is partially formed on each organic insulator 24.

On the organic insulators 24 (also referred to as barrier or bank) covered with the inorganic insulating films 14, auxiliary electrodes 21 are formed. The auxiliary electrodes 21 function to decrease an electric resistance value of the cathode (or the anode). The above-mentioned transparent conductive film has a relatively high resistance value, so that it is difficult to achieve a large screen. However, by providing the auxiliary electrodes 21, the electrodes serving as a cathode (or an anode) can be reduced in resistance as a whole. In addition, the thickness of the transparent conductive film can be reduced.

Further, connection with the wiring or the electrode on the lower layer is achieved using the auxiliary electrodes 21. The auxiliary electrodes 21 may be subjected to film formation or patterning before the EL layer is formed. Through a sputtering method, an evaporation method, or the like, the auxiliary electrodes 21 may be formed of poly-Si doped with an impurity element imparting a conductivity type, an element selected from the group consisting of W, $WSi_x$, Al, Ti, Mo, Cu, Ta, Cr, and Mo, a film mainly containing an alloy material or a compound material mainly containing the element, or a laminate film thereof. Thus, if the transparent conductive film is formed on the auxiliary electrodes 21 in contact therewith which are brought into contact with the electrode on the lower layer, the cathode can be led out. Note that, FIG. 1C is a sectional view taken along the dashed line C–C' of FIG. 2. In FIG. 1C, electrodes connected by the dotted line are electrically connected to each other. Also, in the terminal portion, an electrode of the terminal is formed of the same material as a cathode 10.

Also, a sealing substrate 30 is bonded thereto using the sealing member 33 so as to maintain an interval of about 10 µm, so that all the light emitting elements are sealed. Here, it is desirable to turn the sealing member 33 into a shape like a frame with a small width so as to partially overlap the driver circuit. Annealing is preferably performed in the vacuum for degassing immediately before the sealing substrate 30 is bonded thereto using the sealing member 33. Also, it is preferable to bond the sealing substrate 30 thereto in an atmosphere containing hydrogen and an inert gas (rare gas or nitrogen) and to allow the space sealed by a protective film 32, the sealing member 33, and the sealing substrate 30 to contain hydrogen. Heat generated when the light emitting element emits a light is utilized, which makes it possible to diffuse hydrogen from the space containing it to thereby terminate defects in the organic compound layer with hydrogen. By terminating the defects in the organic compound layer with hydrogen, the light emitting device can be increased in its reliability.

Further, in order to increase color purity, color filters corresponding to the respective pixels are provided on the sealing substrate 30. Among the color filters, a red colored layer 31b is provided opposite to the red light emitting region (R), a green colored layer 31c is provided opposite to the green light emitting region (G), and a blue colored layer 31d is provided opposite to the blue light emitting region (B). Further, regions other than the light emitting regions are light-shielded with black portions of the color filters, i.e., light-shielding portions 31a. Here, the light-shielding portions 31a are formed of a metal film (containing chromium etc.) or an organic film containing a black pigment.

In the present invention, provision of the color filters makes a circular polarization plate unnecessary.

Also, FIG. 1B is a sectional view taken along the dashed line B–B' of FIG. 2. Also in FIG. 1B, the inorganic insulating films 14 cover both ends of portions denoted by 11a to 11c and regions therebetween. In this case, although an example in which an EL layer 17 emitting a red light is used in common is shown, the present invention is not particularly limited to the above. It may be also possible to form the EL layer for each pixel emitting the same color.

Also, in FIGS. 1A to 1C, the protective film 32 is formed so as to increase reliability of the light emitting device, which is an insulating film mainly containing silicon nitride or silicon oxynitride and formed by the sputtering method. Also, in FIGS. 1A to 1C, the protective film is preferably made as thin as possible such that an emitted light passes therethrough.

Further, the protective film 32 is formed after a film containing hydrogen is formed in order to increase reliability of the light emitting device. By forming the film containing hydrogen prior to the formation of the protective film 32, the defects in the organic compound layers 17 to 19 are terminated. The film containing hydrogen may be a thin film mainly containing carbon or a silicon nitride film. As for a method of forming the film containing hydrogen, the film is formed by a plasma CVD method or a sputtering method within a range of temperature to which the organic compound layer can be resistant, for example, a range from room temperature to 100° C. or less. Note that, in FIGS. 1A to 1C, the film containing hydrogen is assumed to partially constitute the protective film and thus is omitted in the figure. Also, the film containing hydrogen may be used as a buffer layer for relaxing a film stress of the protective film 32.

Needless to say, the present invention is not limited to the structure of FIG. 1C. An example of a structure partially different from the one of FIG. 1C is shown in FIGS. 3A to 3D. Here, in FIGS. 3A to 3D, components identical to those of FIGS. 1A to 1C are denoted by identical symbols for simplicity.

Figure 3A:
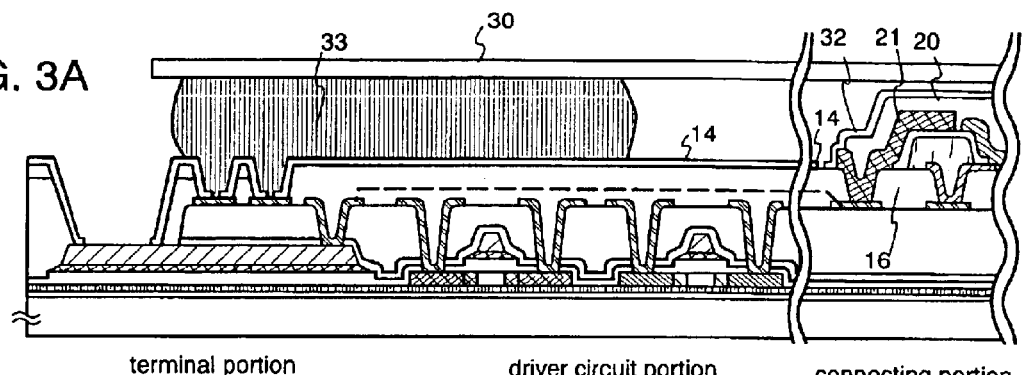
FIGS. 3A to 3D each show a terminal portion in accordance with Embodiment Mode 1 of the present invention.

FIG. 1C shows an example in which the electrode formed of the same material as the cathode (transparent electrode) is provided in the terminal portion. However, FIG. 3A shows an example in which an electrode formed of the same material as a gate electrode of the TFT (a W film as an upper layer and a TaN film as a lower layer) is used to achieve connection with an FPC.

Figure 3B:
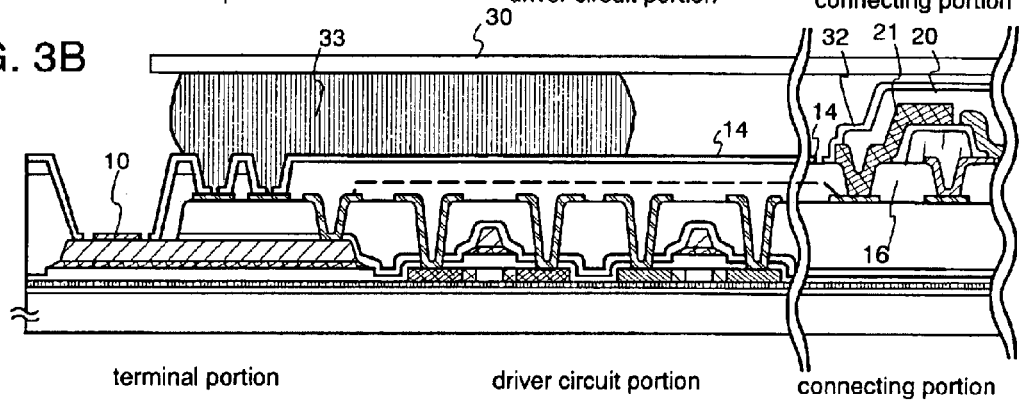

Also, FIG. 3B shows an example in which an electrode 10 made of the same material as a pixel electrode (anode) is used to achieve connection with the FPC. In this example, the electrode 10 is formed on the electrode made of the same material as the gate electrode of the TFT (a W film as an upper layer and a TaN film as a lower layer) in contact therewith.

Figure 3C:
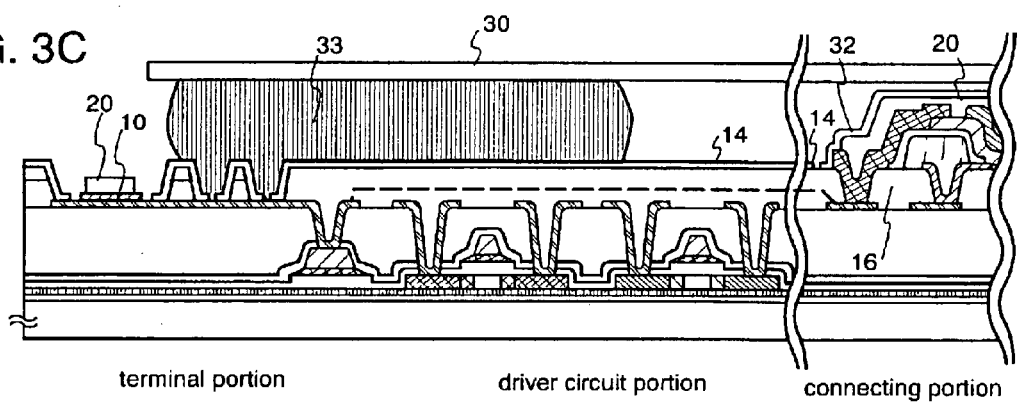

FIG. 3C shows an example in which an electrode for achieving connection with the FPC is an electrode formed of the same material as the cathode 20 (transparent electrode) formed on the electrode 10 made of the same material as the pixel electrode (anode) formed on the lead wiring (wiring in which a TiN film, an Al film, and a TiN film are laminated in the stated order) of the TFT.

Figure 3D:
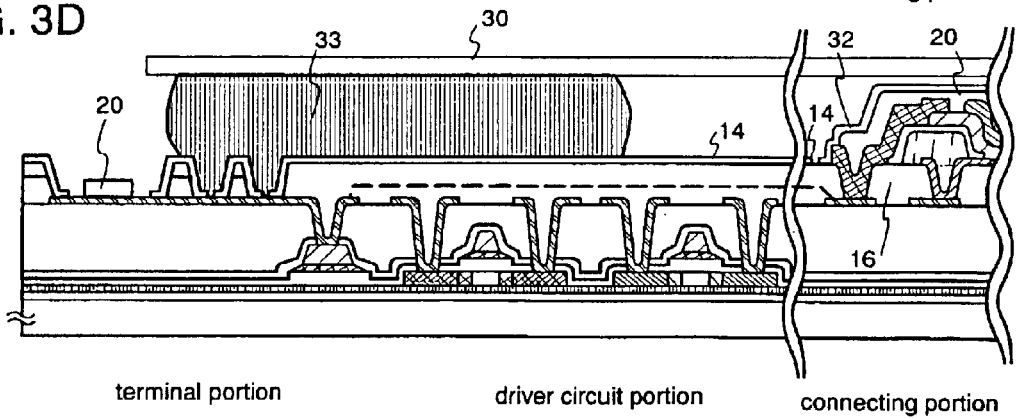

FIG. 3D shows an example in which an electrode for achieving connection with the FPC is an electrode made of the same material as the cathode 20 (transparent electrode) formed on the lead wiring (wiring in which a TiN film, an Al film, and a TiN film are laminated in the stated order) of the TFT.

[Embodiment Mode 2]

Here, the film containing hydrogen and the protective film will be described with reference to FIGS. 4A and 4B.

Figure 4A:
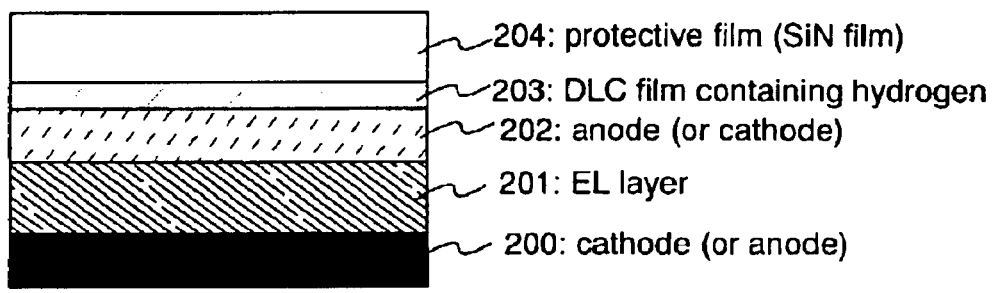
FIGS. 4A and 4B each show a laminate structure in accordance with Embodiment Mode 2 of the present invention.

FIG. 4A is a schematic diagram showing an example of a laminate structure of the EL element. In FIG. 4A, reference numeral 200 denotes a cathode (or an anode); 201, an EL layer; 202, an anode (or a cathode); 203, a DLC film containing hydrogen; and 204, a protective film. When the emitted light is caused to pass through the anode 202, a conductive film having a light-transmissive property (ITO, ZnO, etc.) is preferably used as the anode 202. Also, as the cathode 200, a metal film (an alloy film of MgAg, MgIn, AlLi, etc. or a film formed by coevaporation of aluminum and an element belonging to Group 1 or 2 in the periodic table) or a laminate thereof is preferably used.

The protective film 204 may be made of an insulating film mainly containing silicon nitride or silicon oxynitride which is obtained by a sputtering method (DC system or RF system). The silicon nitride film may be obtained by using a silicon target through the formation in an atmosphere containing nitrogen and argon. Also, a silicon nitride target can be used. The protective film 204 may be also formed by a film formation apparatus using a remote plasma. Further, when the emitted light is caused to pass through the protective film, it is preferable that the protective film is made as thin as possible.

The DLC film 203 containing hydrogen contains carbon and hydrogen with the contents of 70 to 95 atoms % and 5 to 30 atoms %, respectively and thus is extremely hard and superior in an insulating property. The DLC film containing hydrogen may be formed by a plasma CVD method (typically, RF plasma CVD method, microwave CVD method, electron cyclotron resonance (ECR) CVD method, or the like), a sputtering method, or the like.

As a method of forming the DLC film 203 containing hydrogen, the film is formed within a range of temperature to which the organic compound layer can be resistant, for example, a range from room temperature to 100° C. or less.

As a reaction gas used for the film formation when the plasma is generated, a hydrogen gas and a hydrocarbon-based gas (e.g., $CH_4$, $C_2H_2$, $C_6H_6$, or the like) may be used.

Heat treatment is performed within a range of temperature to which the organic compound layer can be resistant and heat generated when the light emitting element emits the light is utilized, so that hydrogen can be diffused from the DLC film containing hydrogen to terminate defects in the organic compound layer with hydrogen (termination). By terminating the defects in the organic compound layer with hydrogen, the light emitting device can be increased in its reliability. Also, when the DLC film containing hydrogen is formed, hydrogen turned into a plasma can be used to terminate defects in the organic compound layer with hydrogen. In addition, the protective film formed so as to cover the DLC film containing hydrogen functions to block hydrogen diffused toward the protective film side and to efficiently diffuse hydrogen into the organic compound layer to thereby terminate defects in the organic compound layer with hydrogen as well. Note that, the DLC film containing hydrogen can serve as the protective film for the light emitting element.

Further, the DLC film containing hydrogen can also serve as a buffer layer. When the silicon nitride film is formed in contact with the film made of the transparent conductive film by a sputtering method, there is a possibility that impurities (In, Sn, Zn, etc.) contained in the transparent conductive film are mixed into the silicon nitride film. However, by forming the DLC film containing hydrogen as a buffer layer therebetween, it is also possible to prevent mixture of the impurities into the silicon nitride film. According to the above structure, the buffer layer is formed, so that the impurities (In, Sn, etc.) can be prevented from mixing therein from the transparent conductive film and a superior protective film having no impurities can be formed.

With such a structure, it is possible to improve reliability as well as to protect the light emitting element.

Figure 4B:
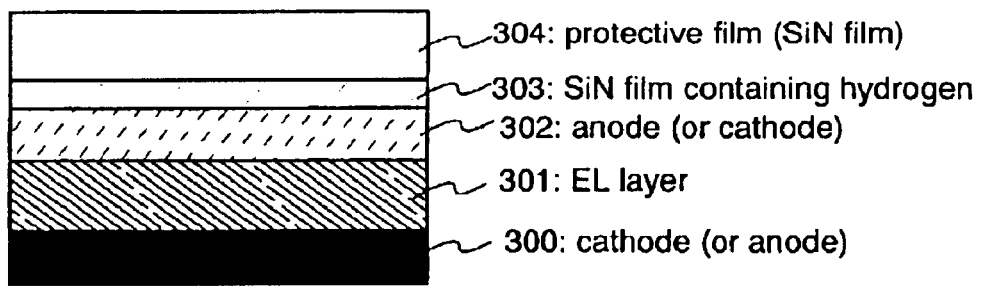

Also, FIG. 4B is a schematic diagram showing another example of the laminate structure of the EL element. In FIG. 4B, reference numeral 300 denotes a cathode (or an anode); 301, an EL layer; 302, an anode (or a cathode); 303, a silicon nitride film containing hydrogen; and 304, a protective film. When the emitted light is caused to pass through the anode 302, it is preferable to form the anode 302 using a conductive material having a light-transmissive property, an extremely thin metal film (MgAg), or a laminate thereof.

Also, when the emitted light is caused to pass through the anode 302, as the anode 302, a conductive film (ITO, ZnO, etc.) having a light-transmissive property is preferably used. Further, as the cathode 300, a metal film (an alloy film of MgAg, MgIn, AlLi, etc. or a film formed by coevaporation of aluminum and an element belonging to Group 1 or 2 in the periodic table) or a laminate thereof is preferably used.

The protective film 304 may be made of an insulating film mainly containing silicon nitride or silicon oxynitride which is obtained by a sputtering method (DC system or RF system). The silicon nitride film may be obtained by using a silicon target through the formation in an atmosphere containing nitrogen and argon. Also, a silicon nitride target can be used. The protective film 304 may be also formed by a film formation apparatus using a remote plasma. Further, when the emitted light is caused to pass through the protective film, it is preferable that the protective film is made as thin as possible.

The silicon nitride film 303 containing hydrogen may be formed by a plasma CVD method (typically, RF plasma CVD method, microwave CVD method, electron cyclotron resonance (ECR) CVD method, or the like), an RF sputtering method, a DC sputtering method, or the like.

As a method of forming the silicon nitride film 303 containing hydrogen, the film is formed within a range of temperature to which the organic compound layer can be resistant, for example, a range from room temperature to 100° C. or less.

When the plasma CVD method is used as the forming method for the silicon nitride film 303 containing hydrogen, as a reaction gas, a gas containing nitrogen (nitrogen oxide-based gas represented by $N_2$ and $NH_3NO_x$ or the like) and a hydrogen silicide-based gas (e.g., silane ($SiH_4$), disilane, trisilane, etc.) may be used.

When the sputtering method is used as the forming method for the silicon nitride film 303 containing hydrogen, a silicon nitride film containing hydrogen may be obtained by using a silicon target through the formation in an atmosphere containing hydrogen, nitrogen, and argon. Also, a silicon nitride target may be used.

Heat treatment is performed within a range of temperature to which the organic compound layer can be resistant and heat generated when the light emitting element emits the light is utilized, so that hydrogen can be diffused from the silicon nitride film containing hydrogen to terminate defects in the organic compound layer with hydrogen (termination). By terminating the defects in the organic compound layer with hydrogen, the light emitting device is increased in its reliability. Also, when the silicon nitride film containing hydrogen is formed, hydrogen turned into a plasma can be used to terminate the defects in the organic compound layer with hydrogen. In addition, the protective film formed so as to cover the silicon nitride film containing hydrogen functions to block hydrogen diffused toward the protective film side and to efficiently diffuse hydrogen into the organic compound layer to thereby terminate defects in the organic compound layer with hydrogen as well. Note that, the silicon nitride film containing hydrogen can also serve as the protective film for the light emitting element.

Further, the silicon nitride film containing hydrogen can serve as a buffer layer as well. When the silicon nitride film is formed in contact with the film made of the transparent conductive film by a sputtering method, there is a possibility that impurities (In, Sn, Zn, etc.) contained in the transparent conductive film are mixed into the silicon nitride film. However, by forming the silicon nitride film containing hydrogen as a buffer layer therebetween, it is also possible to prevent mixture of the impurities into the silicon nitride film. According to the above structure, the buffer layer is formed, so that the impurities (In, Sn, etc.) can be prevented from mixing therein from the transparent conductive film and a superior protective film having no impurities can be formed.

With such a structure, it is possible to improve reliability as well as to protect the light emitting element.

Also, FIGS. 4A and 4B show an example in which the film containing hydrogen is provided as a single layer, but the film may be a laminate consisting of the silicon nitride film containing hydrogen and the DLC film containing hydrogen or a laminate thereof having three or more layers.

Further, this embodiment mode can be applied not only to an active matrix display device but also to a passive display device.

Also, this embodiment mode can be freely combined with Embodiment Mode 1.

[Embodiment Mode 3]

Here, FIGS. 6A to 6C show an example of a structure partially different from FIGS. 1A to 1C. In this example, among a number of pixels arranged regularly in the pixel portion, pixels in a 3×3 matrix are used by way of example and the present invention will be described below. Note that, in a sectional structure, TFTs of FIGS. 6A to 6C are substantially the same as those of FIGS. 1A to 1C and thus components identical to those of FIGS. 1A to 1C are denoted by identical reference numerals for simplicity.

Figure 5A:
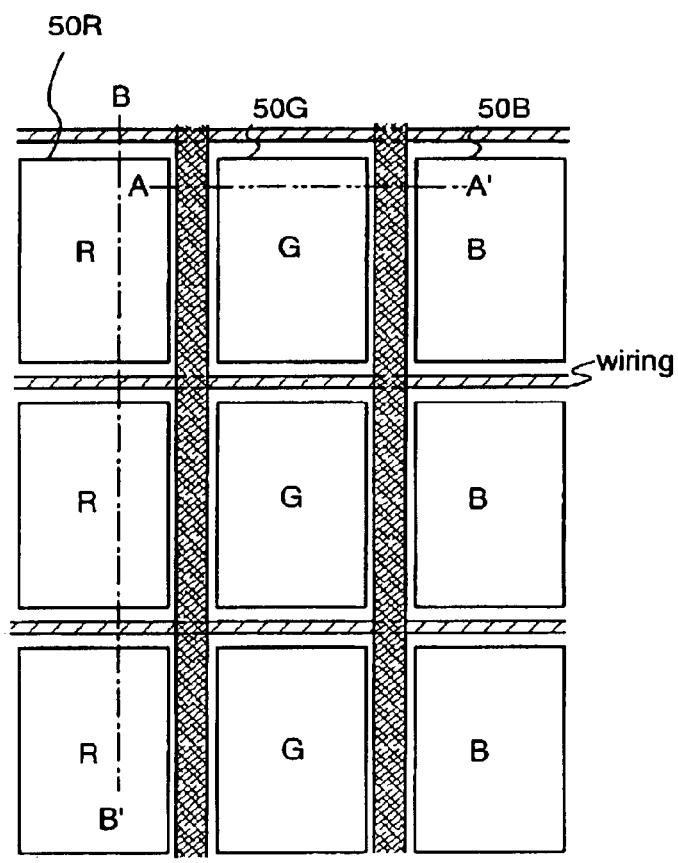
FIGS. 5A and 5B are top views in accordance with Embodiment Mode 3 of the present invention.

FIG. 6A is a sectional view taken along the alternate long and short dash line A–A' of FIG. 5A. A light emitting region 50R indicates a red light emitting region; a light emitting region 50G, a green light emitting region; and a light emitting region 50B, a blue light emitting region. These light emitting regions of three colors realize a light emitting display device capable of full color display.

As shown in FIG. 6A, this embodiment mode employs an example in which patterning is performed using the same mask. Thus, an auxiliary electrode 621 and an organic insulator 624 have substantially the same shape as viewed from the above. In this case, as shown in FIG. 6C, the auxiliary electrode 621 is electrically connected to the wiring made of the same material as a source wiring through the cathode 20.

Also, the pixel electrode 612 (612a to 612c) is formed on the interlayer insulating film 15 and contact holes of the TFTs are formed after the pixel electrode 612 is formed, through which electrodes 607 and 608 subsequently formed electrically connect the pixel electrode 612 and the TFTs. The inorganic insulating films 14 cover both ends of the pixel electrodes and portions therebetween. Also, similarly to FIGS. 1A to 1C, the organic compound layer is formed so as to partially cover the organic insulator 624.

Figure 5B:
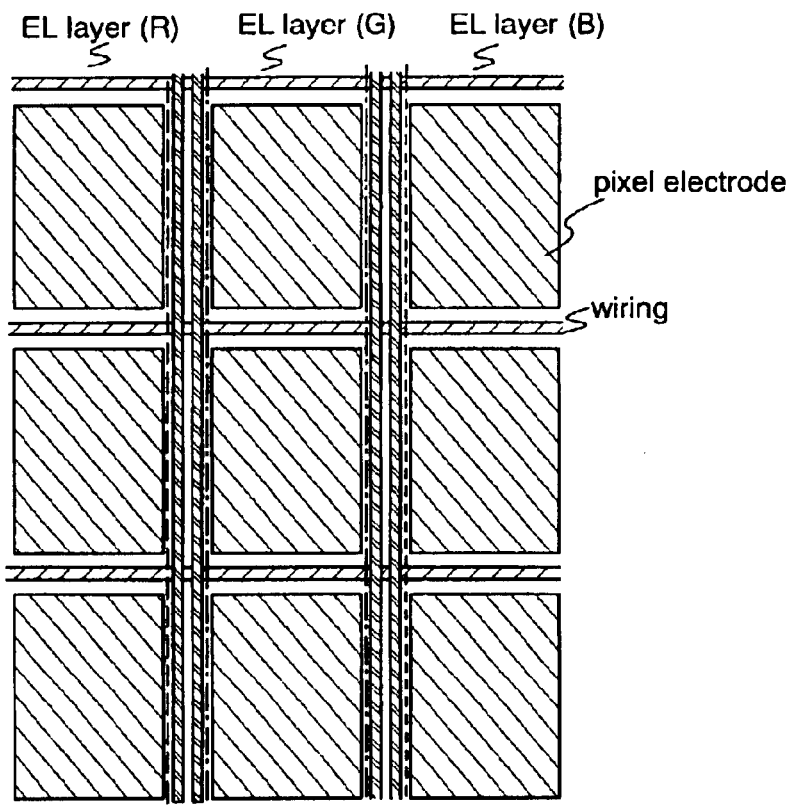

FIG. 5B is a top view showing a pixel electrode immediately after its formation, which corresponds to FIG. 5A. In FIGS. 5A and 5B, the organic compound layer is provided for each pixel column (Y direction). The organic insulator 624 in a strip shape is provided between the organic compound layers differing from each other in color of the emitted light in a strip shape. Also, in FIG. 5A, the organic insulator 624 and the auxiliary electrode 621 are provided for each pixel column (Y direction).

Figure 7A:
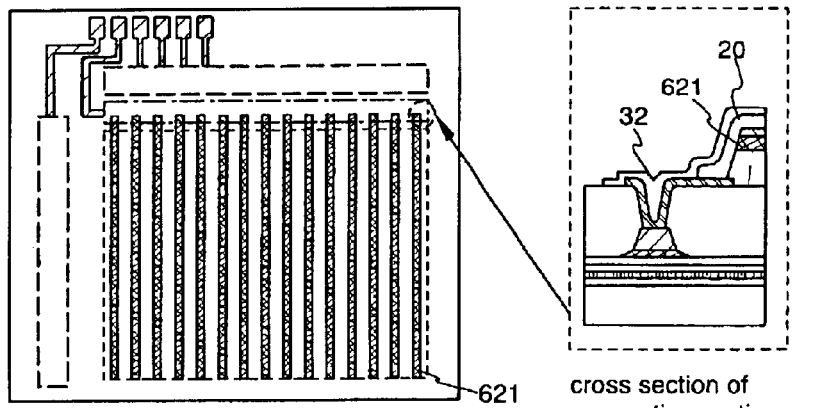
FIGS. 7A to 7C are top views in accordance with Embodiment Mode 3 of the present invention.
Figure 8A:
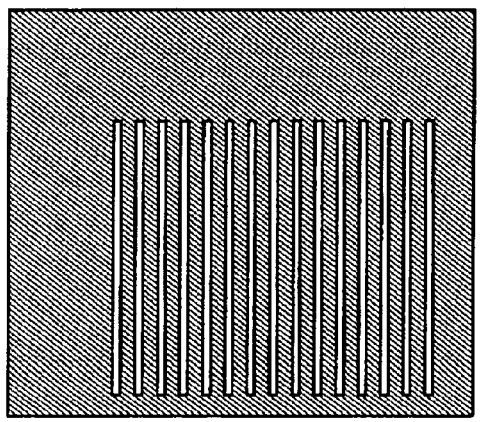
FIGS. 8A to 8C each show a mask in accordance with Embodiment Mode 3 of the present invention.

FIG. 7A is a top view corresponding to FIGS. 5A to 6C. In FIG. 7A, the connection portion in the left-hand portion is partially shown in the right-hand portion in section, which corresponds to the portion shown in FIG. 6C. Further, when the auxiliary electrode 621 and the organic insulator of FIG. 7A are subjected to patterning, a metal mask shown in FIG. 8A as an example is used therefor.

Figure 7B:
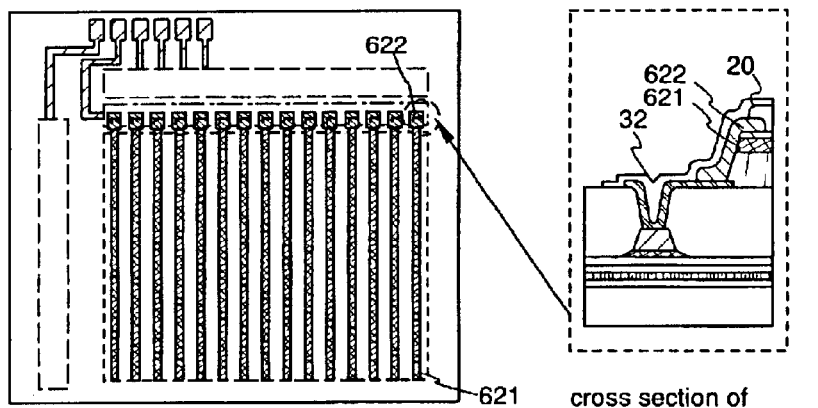

Also, when the film thickness in total of the organic insulator and the auxiliary electrode is relatively large, steps are increased, so that there is a possibility that the transparent conductive film is difficult to use for electrical connection. In particular, in the case where the transparent conductive film is made thin, a line defect may occur due to a poor coverage. Therefore, in order to further ensure connection between the auxiliary electrode 621 and the electrode on the lower layer, as shown in FIG. 7B, the number of masks may be increased to form electrodes denoted by 622. Also, the metal mask may be used to form the electrodes 622 by an evaporation method.

Figure 7C:
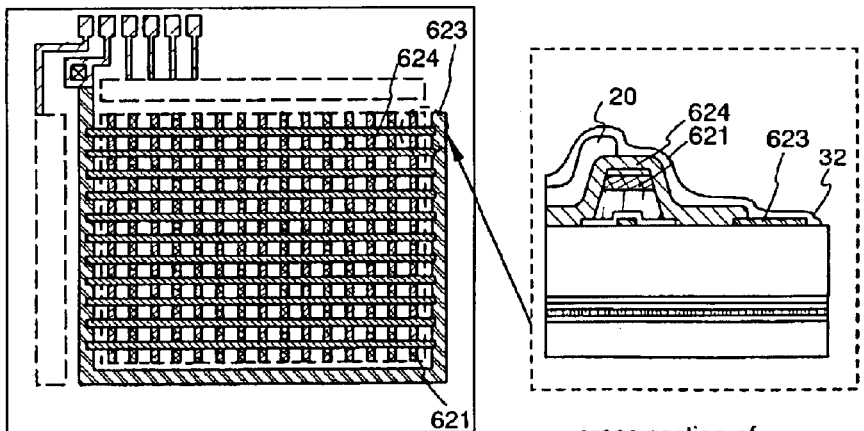
Figure 8B:
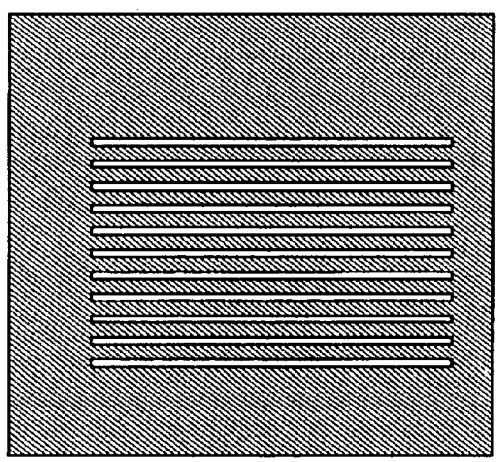

In addition, as shown in FIG. 7C, a wiring 623 made of the same material as the source wiring is formed in advance so as to surround the pixel portion. Following this, second auxiliary electrodes 624 may be formed so as to intersect the auxiliary electrodes 621 at right angles. With this arrangement, each second auxiliary wiring 624 can be provided so as to directly contact the wiring 623 as well as the auxiliary electrode 621. Here, the auxiliary electrode 621 and the second auxiliary electrode 624 are designed such that a portion therebetween serves as the light emitting region as appropriate. Also, when the second auxiliary electrode 624 of FIG. 7A is subjected to patterning, a metal mask shown in FIG. 8B as an example is used therefor.

Figure 8C:
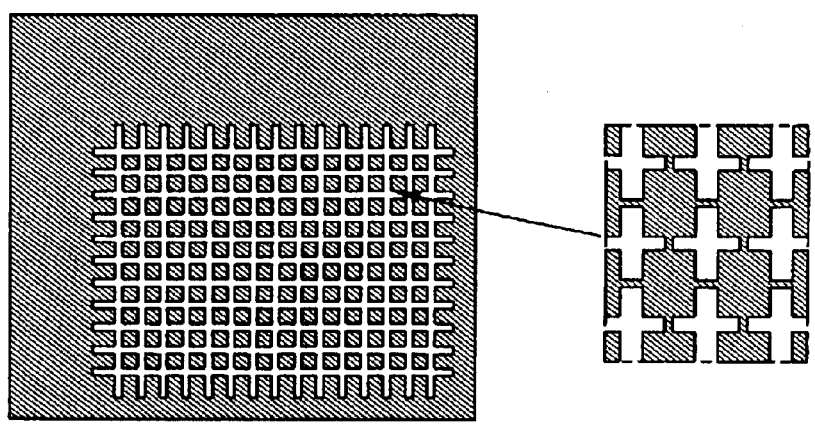

Further, FIG. 7C shows an example in which patterning is performed twice to form the first auxiliary electrode 621 and the second auxiliary electrode 624. However, the auxiliary electrodes may be formed in a lattice shape using the metal mask shown in FIG. 8C. As shown in a right-hand portion of FIG. 8C, openings are divided along the thin line. At the time of evaporation, there is a wrap-around portion, which partially makes a film thin, but the auxiliary electrodes can be formed in a lattice shape.

Also, this embodiment mode can be freely combined with Embodiment Mode 1 or 2.

[Embodiment Mode 4]

Here, an example of a structure partially different from FIGS. 1A to 1C is shown in FIGS. 9A to 9C. In this example, among a number of pixels arranged regularly in the pixel portion, pixels in a 3×3 matrix are used by way of example and the present invention will be described below. Note that, in a sectional structure, the structure is substantially the same as those of FIGS. 1A to 1C except that, the organic insulator 24 is not provided and an organic compound layer 60 made of a polymer is provided on the entire surface. Thus, in FIGS. 9A to 9C, components identical to those of FIGS. 1A to 1C are denoted by identical reference numerals for simplicity. Also, FIG. 9A is a sectional view taken along the dashed line A–A' of FIG. 2.

Instead of providing in the structure of FIGS. 9A to 9C the organic insulator 24 shown in FIGS. 1A to 1C, the inorganic insulating films 14 and auxiliary electrodes 721 serve to maintain the intervals among the organic compounds 17, 18, and 19.

Also, the organic compound layer 60 made of a polymer (typically, poly(ethylene dioxythiophene)/poly(styrene sulfonate) aqueous solution (hereinafter, referred to as "PEDOT/PSS") which serves as a hole injection layer for reference's sake) is formed by a coating method such as a spin coating method or a spray method and thus is formed on the entire surface. Also, the organic compound layer 60 made of a polymer has conductivity, through which electrical connection between the cathode 20 and the auxiliary electrode 721 is achieved. By providing the auxiliary electrode 721, the cathode (or the anode) can be decreased in resistance in its entirety. In addition, the transparent conductive film can be made thin. Further, the auxiliary electrode 721 is used to achieve connection with the wiring or electrode in the lower layer. The auxiliary electrode 721 may be subjected to film formation or patterning before the EL layer is formed. If the transparent conductive film is formed on the auxiliary electrode 721 brought into contact with the electrode in the lower layer, the cathode can be led out. Note that, FIG. 9C is a sectional view taken along the dashed line C–C' of FIG. 2. Further, in FIG. 9C, electrodes connected by the dotted line are electrically connected to each other. In the terminal portion, the electrode of the terminal is formed of the same material as the cathode 20.

Further, FIG. 9B is a sectional view taken along the dashed line B–B' of FIG. 2. Also in FIG. 9B, the inorganic insulating films 14 cover both ends of portions denoted by 11a to 11c and regions therebetween. In this case, although an example in which an EL layer 17 emitting a red light is used in common is shown, the present invention is not particularly limited to the above. It may be also possible to form the EL layer for each pixel emitting the same color.

Further, this embodiment mode can be freely combined with one of Embodiment Mode 1 to Embodiment Mode 3.

[Embodiment Mode 5]

Here, an example of a structure partially different from FIGS. 1A to 1C is shown in FIGS. 10A to 10C. In this example, among a number of pixels arranged regularly in the pixel portion, pixels in a 3×3 matrix are used by way of example and the present invention will be described below. Note that, in a sectional structure, the structure is substan-tially the same as those of FIGS. 1A to 1C except that auxiliary wirings 821 are provided on the cathode 20. Thus, in FIGS. 10A to 10C, components identical to those of FIGS. 1A to 1C are denoted by identical reference numerals for simplicity. Also, FIG. 10A is a sectional view taken along the dashed line A–A' of FIG. 2.

Also, the auxiliary electrodes 821 are formed on the cathode and thus is formed by an evaporation method using the metal mask. In this case, an example in which the auxiliary electrode 821 is formed in a lattice shape. By providing the auxiliary electrode 821, the cathode (or the anode) can be decreased in resistance in its entirety. In addition, the transparent conductive film can be made thin. Further, the auxiliary electrode 821 is used to achieve connection with the wiring or electrode in the lower layer. If the transparent conductive film is formed on the auxiliary electrode 821 brought into contact with the electrode in the lower layer, the cathode can be led out. Note that, FIG. 10C is a sectional view taken along the dashed line C–C' of FIG. 2. Further, in FIG. 10C, electrodes connected by the dotted line are electrically connected to each other. In the terminal portion, the electrode of the terminal is formed of the same material as the cathode 20.

Further, this embodiment mode can be freely combined with one of Embodiment Mode 1 to Embodiment Mode 4.

The present invention thus structured will be further described using the following embodiments in detail.

[Embodiment 1]

In this embodiment, the active matrix type light emitting device formed on the insulating surface is described. As an active element, a thin film transistor is used (hereinafter referred to as TFT) here, a MOS transistor may also be used.

A top gate TFT (specifically a planar TFT) is shown as an example, a bottom gate TFT (typically inverse staggered TFT) may also be used.

In this embodiment, a glass substrate is used, which is made of barium borosilicate glass or aluminoborosilicate glass, a quartz substrate, a silicon substrate, a metal substrate, or stainless substrate forming an insulating film on the surface may be used as a substrate. A plastic substrate having heat resistance enduring a treatment temperature of this embodiment also may be used, and further a flexible substrate may be used.

Next, a silicon oxynitride film is formed as a lower layer of a base insulating film on a heat-resistant glass substrate with a thickness of 0.7 mm by plasma CVD at a temperature of 400° C. using $SiH_4$, $NH_3$, and $N_2O$ as material gas (the composition ratio: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film is formed as an upper layer of the base insulating film by plasma CVD at a temperature of 400° C. using $SiH_4$ and $N_2O$ as material gas (the composition ratio: Si=32%, O=59%, N=7%, H=2%). The silicon oxynitride film has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film (an amorphous silicon film is used here) is 54 nm (preferably 25 to 200 nm) in thickness.

A base insulating film in this embodiment has a two-layer structure. However, the base insulating film may be a single layer or more than two layers of insulating films mainly containing silicon. The material of the semiconductor film is not limited but it is preferable to form the semiconductor film from silicon or a silicon germanium alloy ($Si_XGe_{1-X}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dose to $2\times10^{12}$ atoms/cm$^2$.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time.

After an oxide film on the surface of the silicon film having a crystal structure is removed by diluted fluoric acid or the like, a continuous wave solid-state laser and the second to fourth harmonic of the fundamental wave are employed in order to obtain crystals of large grain size when crystallizing an amorphous semiconductor film. Since the laser light irradiation is conducted in the air or in an oxygen atmosphere, an oxide film is formed on the surface as a result. Typically, the second harmonic (532 nm) or third harmonic (355 nm) of a Nd:YVO$_4$ laser (fundamental wave: 1064 nm) is employed. When using a continuous wave laser, laser light emitted from a 10 W power continuous wave YVO$_4$ laser is converted into harmonic by a non-linear optical element. Alternatively, the harmonic is obtained by putting a YVO$_4$ crystal and a non-linear optical element in a resonator. The harmonic is preferably shaped into oblong or elliptical laser light on an irradiation surface by an optical system and then irradiates an irradiation object. The energy density required at this point is about 0.01 to 100 MW/cm$^2$ (preferably 0.1 to 10 MW/cm$^2$). During the irradiation, the semiconductor film is moved relative to the laser light at a rate of 10 to 2000 cm/s.

Of course, although a TFT can be formed by using the silicon film having a crystallizing structure before the second harmonics of the continuous wave YVO$_4$ laser is irradiated thereon, it is preferable that the silicon film having a crystalline structure after the laser light is irradiated thereon is used to form the TFT since the silicon film irradiated the laser light thereon has an improved crystallinity and electric characteristics of TFT are improved. For instance, although, when TFT is formed by using the silicon film having a crystalline structure before the laser light is irradiated thereon, a mobility is almost 300 cm$^2$/Vs, when TFT is formed by using the silicon film having a crystalline structure after the laser light is irradiated thereon, the mobility is extremely improved with about 500 to 600 cm$^2$/Vs.

After the crystallization is conducted using nickel as a metal element that promotes crystallization of silicon, the second harmonic of the continuous wave YVO$_4$ laser is irradiated thereon though, not limited thereof, after the silicon film is formed having an amorphous structure and the heat treatment is performed for dehydrogenation, and the silicon film having a crystalline structure may be obtained by the second harmonics of the continuous wave YVO$_4$ laser may be irradiated.

The pulse wave laser may be used for as a substitute of the continuous wave laser. In the case that the excimer laser of the pulse wave is used, it is preferable that the frequency is set to 300 Hz, and the laser density is set from 100 to 1000 mJ/cm$^2$ (typically 200 to 800 mJ/cm$^2$). Here, the laser light may be overlapped 50 to 98%.

In addition to the oxide film formed by laser light irradiation, the surface is treated with ozone water for 120 seconds to form as a barrier layer an oxide film having a thickness of 1 to 5 nm in total. The barrier layer here is formed using ozone water but it may be formed by oxidizing the surface of the semiconductor film having a crystal structure through ultraviolet irradiation in an oxygen atmosphere, or formed by oxidizing the surface of the semiconductor film having a crystal structure through oxygen plasma treatment, or by using plasma CVD, sputtering or evaporation to form an about 1 to 10 nm thick oxide film. The oxide film formed by the laser light irradiation may be removed before the barrier layer is formed.

Next, an amorphous silicon film containing argon is formed on the barrier layer by plasma CVD or sputtering to serve as a gettering site. The thickness of the amorphous silicon film is 50 to 400 nm, here 150 nm. The amorphous silicon film is formed in an argon atmosphere with the film formation pressure to 0.3 Pa by sputtering using the silicon target.

Thereafter, heat treatment is conducted in an electric furnace at 650° C. for 3 minutes for gettering to reduce the nickel concentration in the semiconductor film having a crystal structure. Lamp annealing apparatus may be used instead of an electric furnace.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed, the resist mask is removed.

The oxide film is removed by an etchant containing fluoric acid, and at the same time, the surface of the silicon film is washed. Then, an insulating film mainly containing silicon is formed to serve as a gate insulating film. The gate insulating film here is a silicon oxynitride film (composition ratio: Si=32%, O=59%, N=7%, H=2%) formed by plasma CVD to have a thickness of 115 nm.

Next, a laminate of a first conductive film with a thickness of 20 to 100 nm and a second conductive film with a thickness of 100 to 400 nm is formed on the gate insulating film. In this embodiment, a tantalum nitride film with a thickness of 50 nm is formed on the gate insulating film and then a tungsten film with a thickness of 370 nm is laid thereon. The conductive films are patterned by the procedure shown below to form gate electrodes and wirings.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

ICP (Inductively Coupled Plasma) etching is preferred for etching of the first conductive film and second conductive film (first etching treatment and second etching treatment). By using ICP etching and adjusting etching conditions (the amount of electric power applied to a coiled electrode, the amount of electric power applied to a substrate side electrode, the temperature of the substrate side electrode, and the like), the films can be etched and tapered as desired. The first etching treatment is conducted after a resist mask is formed. The first etching conditions include applying an RF (13.56 MHz) power of 700 W to a coiled electrode at a pressure of 1 Pa, employing $CF_4$, $Cl_2$, and $O_2$ as etching gas, and setting the gas flow rate ratio thereof to 25/25/10 (sccm). The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Thereafter, the first etching conditions are switched to the second etching conditions without removing the resist mask. The second etching conditions include using $CF_4$ and $Cl_2$ as etching gas, setting the gas flow rate ratio thereof to 30/30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, the W film and the TaN film are etched to almost the same degree. The first etching conditions and the second etching conditions constitute the first etching treatment.

Next follows the second etching treatment with the resist mask kept in place. The third etching conditions include using $CF_4$ and $Cl_2$ as etching gas, setting the gas flow rate ratio thereof to 30/30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using $CF_4$, $Cl_2$, and $O_2$ as etching gas, setting the gas flow rate ratio thereof to 20/20/20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. At this stage, gate electrode and wirings having the first conductive layer as the lower layer and the second conductive layer as the upper layer are formed.

Next, the resist mask is removed for the first doping treatment to dope with the entire surface using the gate electrodes as masks. The first doping treatment employs ion doping or ion implantation. Here, ion doping conditions are that the dose is set to $1.5 \times 10^{14}$ atoms/cm$^2$, and the acceleration voltage is set from 60 to 100 keV. As an impurity elements that imparts the n-type conductivity, phosphorus (P) or arsenic (As) is typically used. The first impurity regions (n$^{--}$ region) are formed in a self-aligning manner.

Masks formed from resist are newly formed. At this moment, since the off current value of the switching TFT is lowered, the masks are formed to overlap the channel formation region of a semiconductor layer forming the switching TFT of the pixel portion, and a portion thereof. The masks are formed to protect the channel formation region of the semiconductor layer forming the p-channel TFT of the driver circuit and the periphery thereof. In addition, the masks are formed to overlap the channel formation region of the semiconductor layer forming the current control TFT of the pixel portion and the periphery thereof.

An impurity region (n$^-$ region) that overlaps with a portion of the gate electrode is formed by conducting selectively the second doping treatment using the masks from the resist. The second doping treatment is employs ion doping or ion implantation. Here, ion doping is used, the flow rate of gas obtained by diluting phosphine (PH$_3$) with hydrogen to 5% is set to 30 sccm, the dose is set to $1.5 \times 10^{14}$ atoms/cm$^2$, and the acceleration voltage is set to 90 keV. In this case the masks made from resist and the second conductive layer serve as masks against the impurity element that imparts the n-type conductivity and second impurity regions are formed. The second impurity regions are doped with the impurity element that imparts the n-type conductivity in a concentration range of $1 \times 10^{16}$ to $1 \times 10^{17}$ atoms/cm$^3$. Here, the same concentration range as the second impurity region is referred to as a n$^-$ region.

Third doping treatment is conducted without removing the resist masks. The third doping treatment employs ion doping or ion implantation. As impurity elements imparts n-type conductivity, phosphorus (P) or arsenic (As) are used typically. Here, ion doping is used, the flow rate of gas obtained by diluting phosphine (PH$_3$) with hydrogen to 5% is set to 40 sccm, the dose is set to $2 \times 10^{15}$ atoms/cm$^2$, and the acceleration voltage is set to 80 keV. In this case the masks made from resist and the second conductive layer serve as masks against the impurity element that imparts the n-type conductivity and third impurity regions are formed. The third impurity regions are doped with the impurity element that imparts the n-type, conductivity in a concentration range of $1\times10^{20}$ to $1\times10^{21}$ atoms/cm$^3$. Here, the same concentration range as the third impurity region is referred to as a n$^+$ region.

After removing the resist mask and the new resist mask is formed, the fourth doping treatment is conducted. The fourth impurity regions and the fifth impurity regions are formed in which impurity elements imparts p-type conductivity are added to the semiconductor layer forming the p-channel TFT by the fourth doping treatment.

The concentration of the impurity element that imparts the p-type conductivity is set from $1\times10^{20}$ to $1\times10^{21}$ atoms/cm$^3$ to add to the fourth impurity regions. The fourth impurity regions being region (n$^{--}$ region) are already doped with phosphorus (P) in the previous step but are doped with the impurity element that imparts the p-type conductivity in a concentration 1.5 to 3 times the phosphorus concentration to obtain the p-type conductivity. Here, a region having the same concentration range as the fourth impurity regions is also called a p$^+$ region.

The fifth impurity regions are formed in the region overlaps with the taper portion of the second conductive layer. The impurity elements imparts p-type conductivity is added thereto at the concentration range from $1\times10^{18}$ to $1\times10^{20}$ atoms/cm$^3$. Here, the region having the same concentration range as the fifth impurity regions is also referred to as p$^-$ region.

Through the above steps, an impurity region having the n-type or p-type conductivity is formed in each semiconductor layer. The conductive layers become the gate electrode of TFT.

An insulating film is formed to cover almost the entire surface (not shown). In this embodiment, the silicon oxide film having 50 nm in thickness is formed by plasma CVD method. Of course, the insulating film is not limited to a silicon oxide film and a single layer or laminate of other insulating films containing silicon may be used.

The next step is activation treatment of the impurity elements used to dope the semiconductor layers. The activation step employs rapid thermal annealing (RTA) using a lamp light source, irradiation of a laser, heat treatment using a furnace, or a combination of these methods.

In the example shown in this embodiment, the interlayer insulating film is formed after the above-described activation. However, the insulating film may be formed before the activation.

The first interlayer insulating film made from a silicon nitride film is formed. Then, the semiconductor layers are subjected to heat treatment (at 300 to 550° C. for 1 to 12 hours) to hydrogenate the semiconductor layers. This step is for terminating dangling bonds in the semiconductor layers using hydrogen contained in the first interlayer insulating film. The semiconductor layers are hydrogenated irrespective of the presence of the interlayer insulating film that is a silicon oxide film. Other hydrogenation methods employable include plasma hydrogenation (using hydrogen excited by plasma).

Next, a second interlayer insulating film is formed on the first interlayer insulating film from an organic insulating material. In this embodiment, an acrylic resin film is formed to have a thickness of 1.6 µm by application method.

Formed next are contact holes reaching the conductive layers that serve as the gate electrodes or gate wirings and contact holes reaching the impurity regions. In this embodiment, etching treatment is conducted several times in succession. Also, in this embodiment, the first interlayer insulating film is used as an etching stopper to etch the second interlayer insulating film, and then the first interlayer insulating film is etched.

Thereafter, electrodes, specifically, a source wiring, a power supply line, a lead-out electrode, a connection electrode, etc. are formed from Al, Ti, Mo, or W. Here, the electrodes and wirings are obtained by patterning a laminate of a Ti film (100 nm in thickness), an Al film containing silicon (350 nm in thickness), and another Ti film (50 nm in thickness). The source electrode, source wiring, connection electrode, lead-out electrode, power supply line, and the like are thus formed as needed. A lead-out electrode for the contact with a gate wiring covered with an interlayer insulating film is provided at an end of the gate wiring, and other wirings also have at their ends input/output terminal portions having a plurality of electrodes for connecting to external circuits and external power supplies. A driving circuit having a CMOS circuit in which an n-channel TFT and a p-channel TFT are combined complementarily and a pixel portion with a plurality of pixels each having an n-channel TFT or a p-channel TFT are formed in the manner described above.

Next, the third interlayer insulating film made of inorganic insulating material is formed on the second interlayer insulating film. In this embodiment, the silicon nitride film with a thickness of 200 nm is formed by sputtering.

Next, a contact hole that reaches the connection electrode that contacts with the drain region of the current control TFT by p-channel type TFT is formed. Next, the pixel electrode is formed with connecting and overlapping the TFT connection electrode. In this embodiment, the materials with a large work function, concretely platinum (Pt), chrome (Cr), tungsten (W), nickel (Ni), because the pixel electrode is made to function as an anode of an organic light emitting element.

Next, inorganic insulators are formed at both ends to cover the edge of the pixel electrode. Inorganic insulators with covering the edge of pixel electrode are made with the insulating film containing silicon by sputtering and then performed patterning. Instead of insulators, a bank composed of organic materials may be formed.

Next, a supporting electrode is formed on the inorganic insulators as shown in Embodiment Mode 1.

Next, EL layer and a cathode of an organic light emitting element are formed on the pixel electrode of which both edges are covered by inorganic insulators. Inc jet method, evaporation method, spin coating method and the like may be used for forming the EL layer.

An EL layer (a layer for light emission and for moving of carriers to cause light emission) has a light emitting layer and a free combination of electric charge transporting layers and electric charge injection layers. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

Also, it is assumed as being preferable that as a material for the cathode, metals having a low work function (typically, metal elements belonging to Group 1 or Group 2 in the periodic table) or alloys containing these are used. As the work function becomes lower, the light emission efficiency becomes higher. Thus, in particular, it is desirable that a material with a laminate structure is used as the material for the cathode, which is obtained by depositing an alloy of MgAg, MgIn, AlLi, etc. into a thin film or forming a thin film through coevaporation of aluminum and an element belonging to Group 1 or 2 in the periodic table, and subsequently forming a transparent conductive film (an alloy of an indium oxide and a tin oxide (ITO), an alloy of an indium oxide and a zinc oxide ($In_2O_3$—ZnO), an zinc oxide (ZnO), and the like).

Next, the protective film covering the cathode is formed. The protective film may be formed of an insulating film mainly containing silicon nitride or silicon oxynitride by a sputtering method. As shown in Embodiment Mode 2, the defects in the EL layer are terminated with hydrogen (termination) and thus, it is preferable to form the film containing hydrogen on the cathode.

The film containing hydrogen may be formed of an insulating film mainly containing carbon or silicon nitride by a PCVD method. At the time of film formation, it is also possible to terminate the defects in the organic compound layer with hydrogen turned into a plasma. Heat treatment is performed within a range of temperature to which the organic compound layer can be resistant and heat generated when the light emitting element emits light is utilized, so that hydrogen can be diffused from the film containing hydrogen to terminate defects in the organic compound layer with hydrogen (termination).

Also, the film containing hydrogen and the protective film are used to prevent from entering from the outside the substance such as moisture or oxygen which causes deterioration of the EL layer due to oxidation. Note that, in an input/output terminal portion to be connected with the FPC later, there is not required to provide the protective film, the film containing hydrogen, and the like.

Also, various circuits composed of a plurality of TFTs etc. may be provided to lead to the gate electrode of the TFT arranged in the pixel portion. Needless to say, there is not imposed a particular limitation thereon.

Next, the organic light emitting element including at least the cathode, the organic compound layer, and the anode is enclosed by the sealing substrate or a sealing can. Thus, the organic light emitting element is preferably blocked from the outside completely to prevent from entering from the outside the substance such as moisture or oxygen which causes deterioration of the EL layer due to oxidation. It is preferable that degassing is performed by annealing in the vacuum immediately before enclosure with the sealing substrate or the sealing can. Also, when the sealing substrate is bonded to the substrate, it is preferable that the procedure is performed in an atmosphere containing hydrogen and inert gas (rare gas or nitrogen) and a space sealed by sealing contains hydrogen. Heat generated when the light emitting element emits a light is utilized, which makes it possible to diffuse hydrogen from the space containing hydrogen to thereby terminate defects in the organic compound layer with hydrogen. By terminating the defects in the organic compound layer with hydrogen, the light emitting device can be increased in its reliability.

Subsequently, an FPC (flexible printed circuit) is bonded to each electrode in the input/output terminal portion by using an anisotropic conductive member. The anisotropic conductive member consists of resin and conductive particles having a particle size of several tens to several hundreds of $\mu$m with its surface plated with Au or the like. The conductive particles serve to electrically connect each electrode of the input/output terminal portion and the wiring formed on the FPC.

Also, the substrate is provided with the color filters corresponding to the respective pixels and then, provision of the color filters makes a circular polarization plate unnecessary. Further, another optical film may be provided if necessary and an IC chip etc. may be mounted thereon.

Through the above steps, the modularized light emitting device connected with the FPC is completed.

Further, this embodiment can be freely combined with one of Embodiment Mode 1 to Embodiment Mode 5.

[Embodiment 2]

Figure 11:
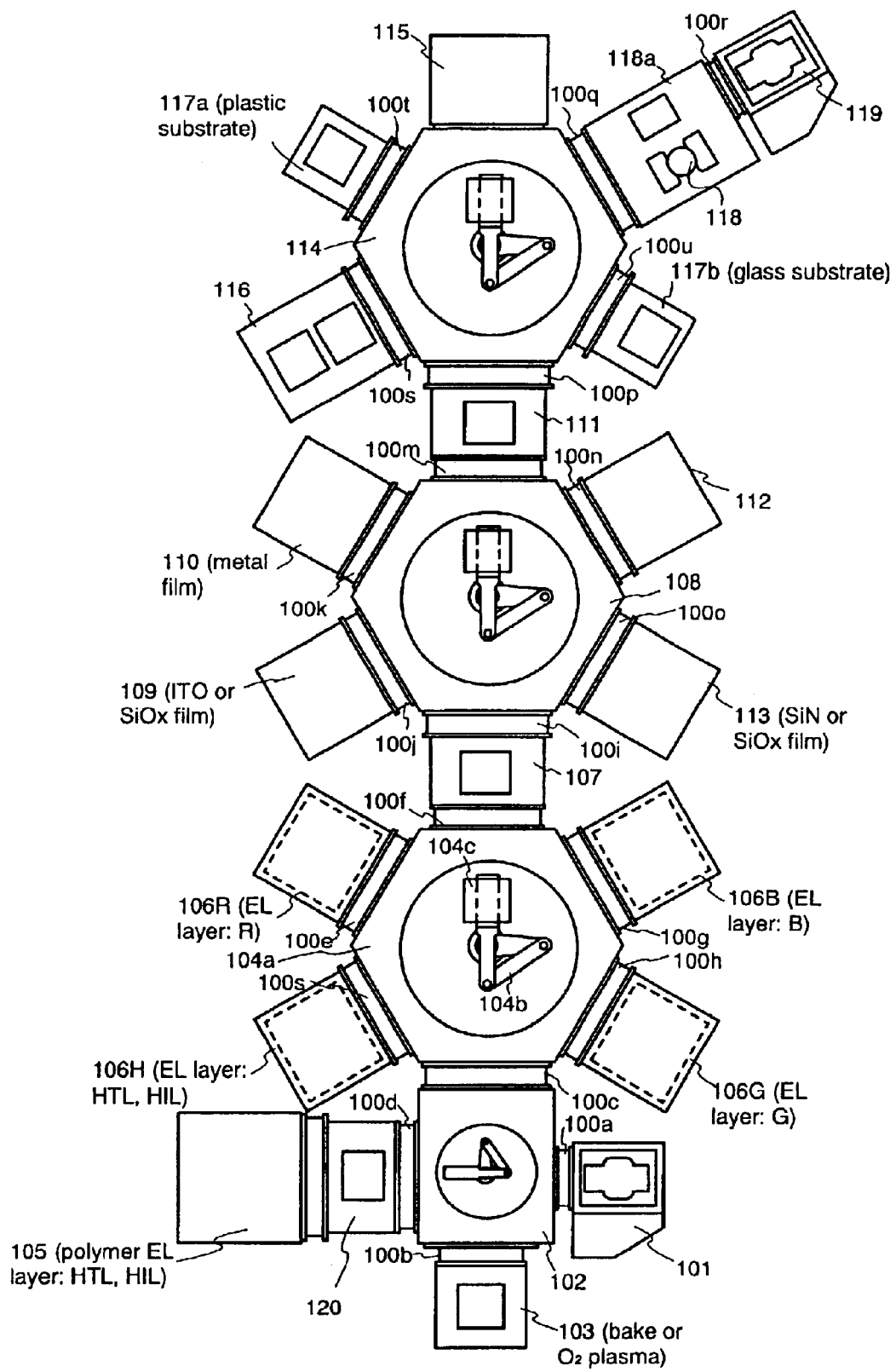
FIG. 11 shows an example of a manufacturing apparatus in accordance with Embodiment 2 of the present invention.

In this embodiment, a manufacturing apparatus will be shown with reference to FIG. 11.

In FIG. 11, reference symbols 100*a* to 100*k*, and 100*m* to 100*v* each denote a gate; 101 and 109, a delivery chamber; 102, 104*a*, 107, 108, 111, and 114, a transportation chamber; 105, 106R, 106B, 106G, 106H, 109, 110, 112, and 113, a film formation chamber; 103, a pretreatment chamber; 117*a* and 117*b*, a sealing substrate loading chamber; 115, a dispenser chamber; 116, a sealing chamber; 118*a*, a ultraviolet irradiating chamber; and 120, a substrate inverting chamber.

Hereinafter, the substrate previously having formed the TFT thereon is carried in the manufacturing apparatus shown in FIG. 11. Here, a procedure for forming a laminate structure shown in FIG. 4A is explained.

First, the substrate is set in the delivery chamber 101, on which the TFT and the cathode (or the anode) 200 are formed, and is then transported to the transportation chamber 102 connected to the delivery chamber 101. It is preferable that vacuum-exhausting is conducted on the transportation chamber to attain an atmospheric pressure by introducing the inert gas in advance such that the moisture or oxygen in the transportation chamber is suppressed to as low level as possible.

Also, the transportation chamber 102 is connected to a vacuum exhausting processing chamber for making the inside of the transportation chamber vacuum. The vacuum exhausting processing chamber is equipped with a magnetic levitation type turbo molecular pump, a cryopump, or a dry pump. With this structure, it is possible that the ultimate vacuum of the transportation chamber is set to $10^{-5}$ to $10^{-6}$ Pa and the impurity is controlled so as not to diffuse backward from the pump side or exhausting system. In order to prevent the introduction of the impurity into the inside of the apparatus, as a gas to be introduced, an inert gas such as nitrogen or a rare gas is used. These gases introduced to the inside of the apparatus are required to be highly purified by a gas purifier prior to the introduction into the apparatus when they are used. Accordingly, it is necessary to provide the gas purifier in order to introduce into the film formation apparatus the gas after being highly purified. Thus, the oxygen or moisture contained in the gas and other impurities can be eliminated in advance, so that it is possible to prevent such impurities from being introduced to the inside of the apparatus.

Also, in order to eliminate the moisture or other gases contained in the substrate, it is preferable to perform annealing for degassing in the vacuum. Therefore, the substrate is transported to the pretreatment chamber 103 connected to the transportation chamber 102 and annealing may be performed there. Further, when the surface of the cathode is required to be cleaned, the substrate is transported to the pretreatment chamber 103 connected to the transportation chamber 102 and cleaning may be performed there.

It is also possible to form the poly(ethylene dioxythiophene)/poly(styrene sulfonate) aqueous solution (PEDOT/PSS) serving as a hole injection layer on the entire surface of the anode as needed. In the manufacturing apparatus of FIG. 11, the film formation chamber 105 for forming the organic compound layer made of a polymer is provided. When a spin coating method, an ink jet method, or a spray method is used for the formation thereof, the substrate is set under the atmospheric pressure such that a surface subjected to film formation is faced upward. The substrate is inverted as appropriate in the substrate inverting chamber 120 provided between the film formation chamber 105 and the transportation chamber 102. Also, after the film formation is performed using the aqueous solution, it is preferable to transport the substrate to the pretreatment chamber 103 where moisture is vaporized by performing heat treatment in the vacuum.

Next, a substrate 104c is transported to the transportation chamber 104 from the transportation chamber 102 without being exposed to the atmosphere and then, transported to the film formation chamber 106R by a transportation mechanism 104b to form on the cathode 200 the EL layer for emitting a red light as appropriate. Here, an example in which it is formed by evaporation is shown. The substrate is set in the film formation chamber 106R after being inverted in the substrate inverting chamber 120 such that the surface subjected to film formation is faced downward. Note that, it is preferable to perform vacuum exhausting on the film formation chamber before the substrate is carried therein.

For example, in the film formation chamber 106R subjected to vacuum exhausting to $5\times10^{-3}$ Torr (0.665 Pa) or less, preferably $10^{-4}$ to $10^{-6}$ Pa in degree of vacuum, evaporation is conducted. At the time of evaporation, the organic compounds are vaporized in advance by resistance heating and are scattered toward the substrate when a shutter (not shown) is opened at this time. The vaporized organic compounds are scattered upward and evaporated onto the substrate through the opening (not shown) provided on the metal mask (not shown). Note that, upon the evaporation, a substrate temperature ($T_1$) is set to 50 to 200° C., preferably 65 to 150° C., using a means for heating the substrate.

When the three types of EL layers are formed in order to attain a full color display, after being formed in the film formation chamber 106R, they may be formed through film formation in the film formation chambers 106G and 106B in order.

After the desired EL layer 201 is formed on the cathode (or the anode) 200, the substrate is transported to the transportation chamber 107 from the transportation chamber 104 without being exposed to the air and is subsequently transported to the transportation chamber 108 from the transportation chamber 107 also without being exposed to the air.

Next, the substrate is transported to the film formation chamber 109 using a transportation mechanism placed in the transportation chamber 108. The anode 202 made of a transparent conductive film (ITO etc.) is formed on the EL layer 201 as appropriate. In the case where the cathode is formed, a thin metal layer serving as a cathode is formed in the film formation chamber 110, the substrate is then transported to the film formation chamber 109 to form a transparent conductive film, and a laminate consisting of the thin metal layer (cathode) and the transparent conductive film is appropriately formed. In this case, the film formation chamber 110 corresponds to an evaporation apparatus including Mg, Ag, or Al used as the cathode as an evaporation source and the film formation chamber 109 corresponds to a sputtering apparatus including at least a target made of a transparent conductive material used as the anode.

Next, the substrate is transported to the film formation chamber 112 using a transportation mechanism placed in the transportation chamber 108, in which the film 203 containing hydrogen is formed within a range of temperature to which the organic compound layer can be resistant. In this case, the film formation chamber 112 is provided with a plasma CVD apparatus and as a reaction gas used for the film formation, a hydrogen gas and a hydrocarbon-based gas (e.g., $CH_4$, $C_2H_2$, $C_6H_6$, or the like) are used to thereby form the DLC film containing hydrogen. Note that, there is not imposed a particular limitation thereon as long as a means for generating a hydrogen radical is provided therefor. At the time of the film formation of the DLC film containing hydrogen, the defects in the organic compound layer is terminated with hydrogen turned into a plasma.

Subsequently, the substrate is transported to the film formation chamber 113 from the transportation chamber 108 without being exposed to the air to form the protective film 204 on the film 203 containing hydrogen. Here, the sputtering apparatus is employed in which the target of silicon or silicon nitride is included in the film formation chamber 113. An atmosphere of the film formation chamber is set to a nitrogen atmosphere or an atmosphere containing nitrogen and argon, so that the silicon nitride film can be formed.

Through the above steps, the laminate structure shown in FIG. 4A, i.e., the light emitting element covered with the protective film and the film containing hydrogen is formed on the substrate.

Next, the substrate having formed the light emitting element thereon is transported to the transportation chamber 111 from the transportation chamber 108 without being exposed to the air and further, is transported to the transportation chamber 114 from the transportation chamber 111.

Following this, the substrate having formed the light emitting element thereon is transported to the sealing chamber 116 from the transportation chamber 114. Here, it is preferable to prepare a sealing substrate provided with a sealing member in the sealing chamber 116.

The sealing substrate is set in the sealing substrate loading chambers 117a and 117b from the outside. Here, in order to eliminate the impurity such as moisture, it is preferable to perform annealing in advance in the vacuum, for example, in the sealing substrate loading chambers 117a and 117b. When the sealing member is formed on the sealing substrate, after the transportation chamber 108 is set to an atmospheric pressure, the sealing substrate is transported to the dispenser chamber 115 from the sealing substrate loading chamber, the sealing member is formed for bonding it to the substrate on which the light emitting element is formed, and the sealing substrate having formed the sealing member thereon is transported to the sealing chamber 116.

Next, for degassing the substrate on which the light emitting element is formed, annealing is performed in the vacuum or in the inert gas atmosphere. Then, the sealing substrate having formed the sealing member thereon and the substrate having formed the light emitting element thereon are bonded to each other. Also, a sealed space is filled with hydrogen or inert gas. Note that, in this case, an example is shown in which the sealing member is formed on the sealing substrate, but the present invention is not particularly limited to this and the sealing member may be formed on the substrate having formed the light emitting element thereon.

Next, a pair of substrates bonded to each other are transported from the transportation chamber 114 to the ultraviolet irradiating chamber 118, where the substrates are irradiated with a ultraviolet light to cure the sealing member. Note that, in this example, ultraviolet curable resin is used for the sealing member, but any sealing member can be used with no particular limitation as long as it is an adhesive.

Subsequently, the substrates are transported from the transportation chamber 114 to the delivery chamber 119 and are taken out.

As described above, the manufacturing apparatus shown in FIG. 11 is used, which makes it possible to prevent the light emitting element from being exposed to the outside air until it is completely enclosed in the sealed space. Thus, the light emitting device high in reliability can be manufactured. Note that, the transportation chambers 102 and 114 take repeatedly a vacuum state and a state at atmospheric pressure, whereas the transportation chambers 104a and 108 are always kept vacuum.

Note that, a film formation apparatus of an in-line system can be employed.

Figure 12:
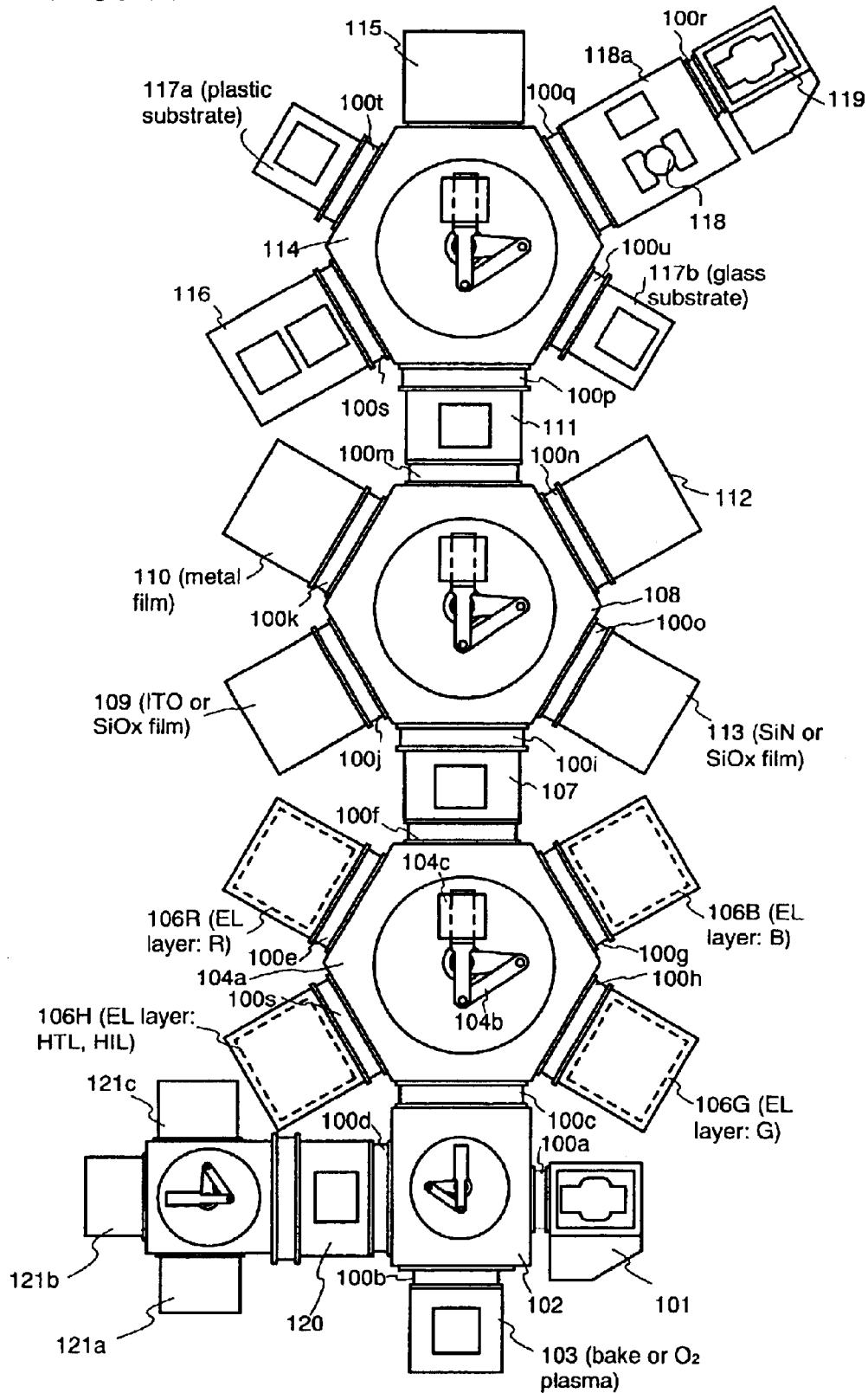
FIG. 12 shows an example of a manufacturing apparatus in accordance with Embodiment 2 of the present invention.

Further, FIG. 12 shows a manufacturing apparatus partially different from that of FIG. 11.

FIG. 11 shows an example in which the film formation chamber for forming the film using the spin coating method, ink jet method, or spray method is singly formed, whereas in an example of the manufacturing apparatus of FIG. 12, three film formation chambers for forming the film using the spin coating method, ink jet method, or spray method are formed. For example, when three types of EL layers are formed for achieving a full color display by the spin coating method, ink jet method, or spray method, after the film formation in the film formation chamber 121a, they may be formed sequentially in the respective film formation chambers 121b and 121c.

Note that, this embodiment can be freely with one of Embodiment Mode 1 to Embodiment Mode 5 and Embodiment 1.

[Embodiment 3]

The EL modules (active matrix EL module, passive EL module) can be completed by implementing the present invention. Namely, all of the electronic equipments are completed by implementing the present invention.

Following can be given as such electronic equipments: video cameras; digital cameras; head mounted displays (goggle type displays); car navigation systems; car stereos; personal computers; portable information terminals (mobile computers, cell phones or electronic books etc.) etc. Examples of these are shown in FIG. 13 and FIG. 14.

Figure 13A:
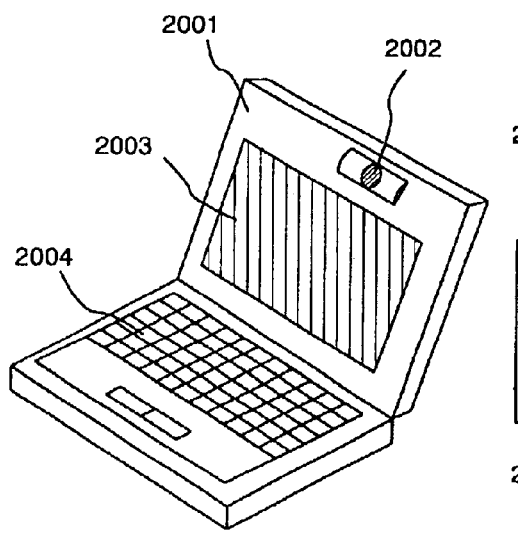
FIGS. 13A to 13F each show an example of an electronic device.

FIG. 13A is a personal computer which comprises: a main body 2001; an image input section 2002; a display section 2003; and a keyboard 2004 etc.

Figure 13B:
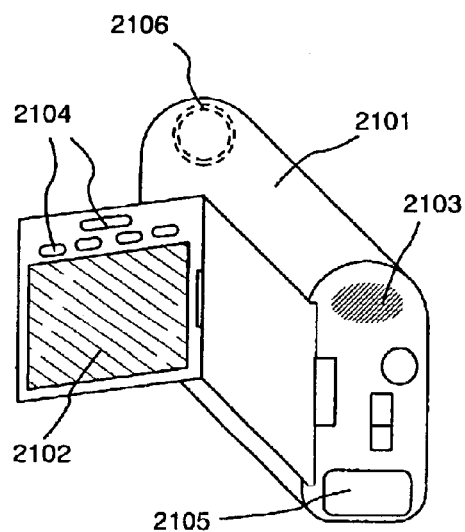

FIG. 13B is a video camera which comprises: a main body 2101; a display section 2102; a voice input section 2103; operation switches 2104; a battery 2105 and an image receiving section 2106 etc.

Figure 13C:
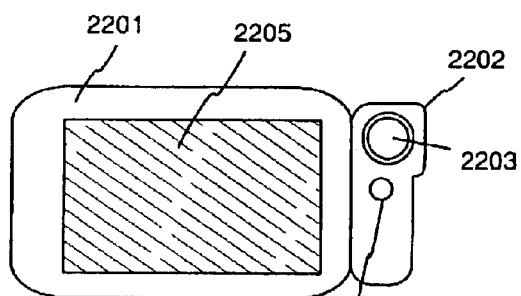

FIG. 13C is a mobile computer which comprises: a main body 2201; a camera section 2202; an image receiving section 2203; operation switches 2204 and a display section 2205 etc.

Figure 13D:
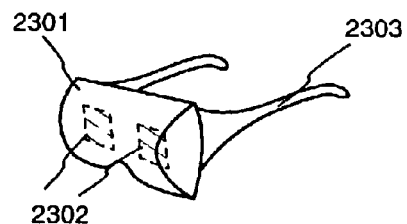

FIG. 13D is a goggle type display which comprises: a main body 2301; a display section 2302; and an arm section 2303 etc.

Figure 13E:
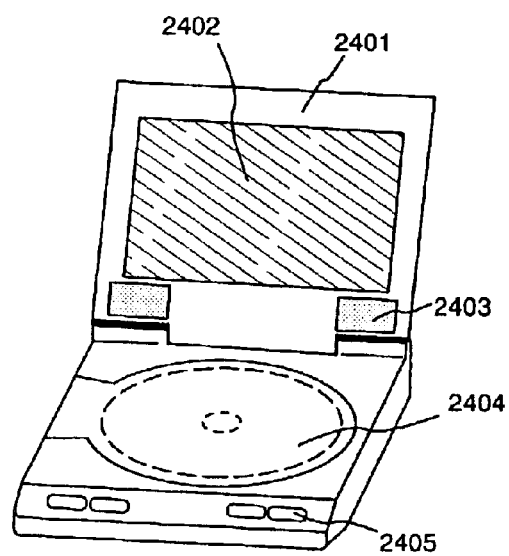

FIG. 13E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (Digital Versatile Disc), CD, etc. for the recording medium, and can perform music appreciation, film appreciation, games and use for Internet.

Figure 13F:
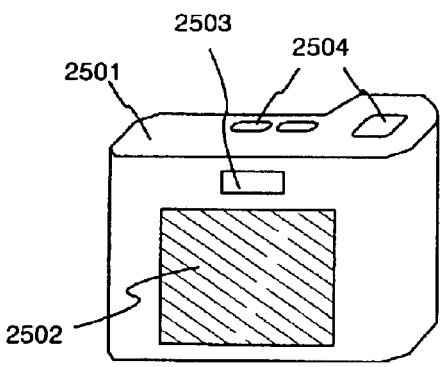

FIG. 13F is a digital camera which comprises: a main body 2501; a display section 2502; a view finder 2503; operation switches 2504; and an image receiving section (not shown in the figure) etc.

Figure 14A:
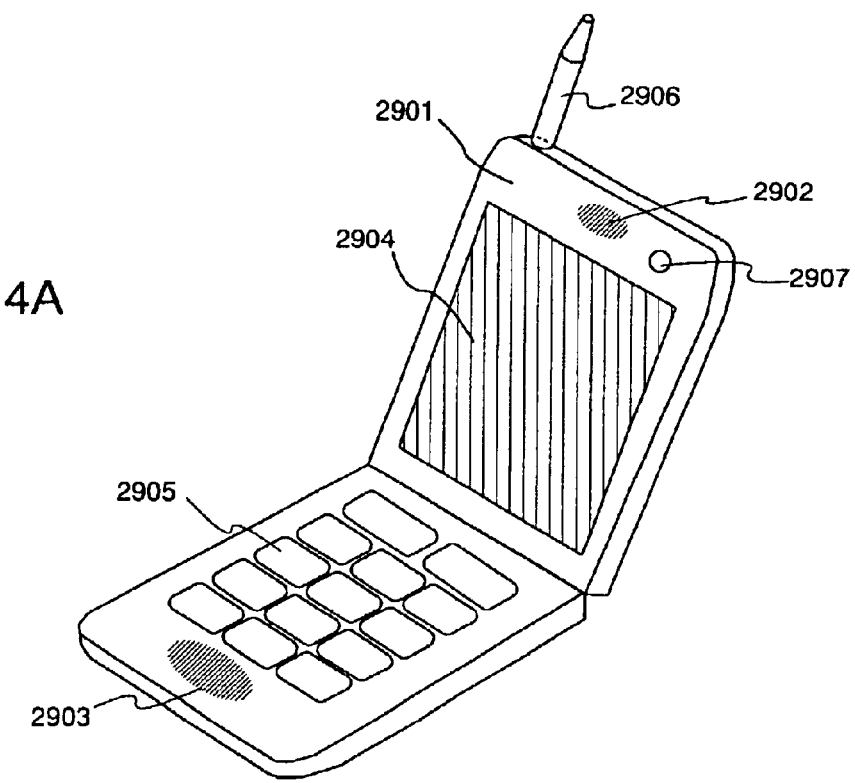
FIGS. 14A to 14C each show an example of an electronic device.

FIG. 14A is a portable telephone which comprises: a main body 2901; a voice output section 2902; a voice input section 2903; a display section 2904; operation switches 2905; an antenna 2906; and an image input section (CCD, image sensor, etc.) 2907 etc.

Figure 14B:
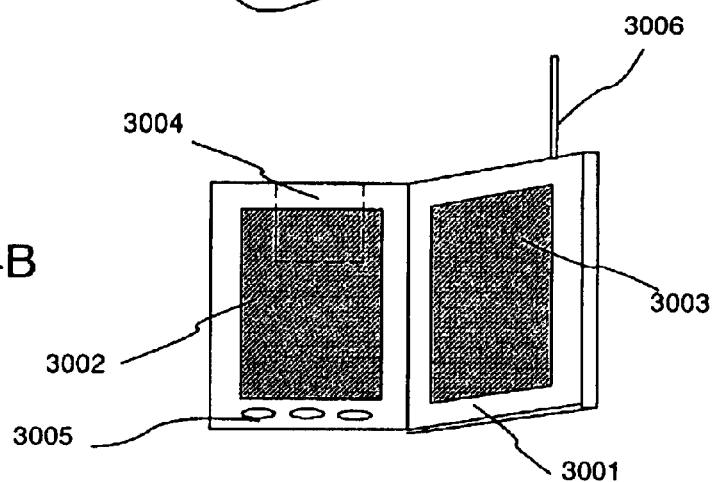

FIG. 14B is a portable book (electronic book) which comprises: a main body 3001; display sections 3002 and 3003; a recording medium 3004; operation switches 3005 and an antenna 3006 etc.

Figure 14C:
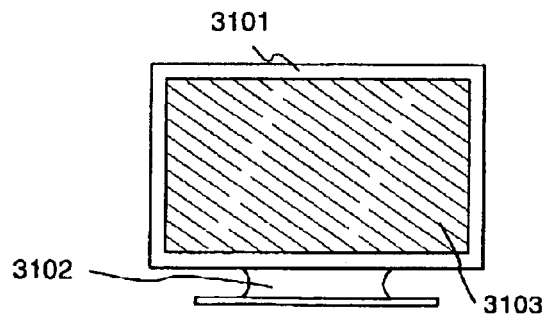

FIG. 14C is a display which comprises: a main body 3101; a supporting section 3102; and a display section 3103 etc.

In addition, the display shown in FIG. 14C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electronic equipments of various areas. Note that the electronic devices of this embodiment can be achieved by utilizing any combination of constitutions in Embodiment Modes 1 to 5, Embodiment 1 or 2.

According to the present invention, the defect in the organic compound layer can be terminated with hydrogen, whereby the light emitting device can be increased in its reliability.

Also, according to the present invention, it is possible to dispense with the circular polarization film extremely expensive, whereby the manufacturing cost can be reduced.

Also, according to the present invention, it is possible to realize high definition, high opening ratio, and high reliability in the flat panel display capable of full color display using light emission colors of red, green, and blue.

What is claimed is:

1. A light emitting device comprising:
   a pixel portion having a plurality of light emitting elements, each including a first electrode electrically connected to a thin film transistor, an organic compound layer formed on the first electrode, and a second electrode formed on the organic compound layer;
   a driver circuit; and
   a terminal portion,
   wherein an end portion of the first electrode is covered with an insulator, a third electrode comprising a conductive material is formed on the insulator, the organic compound layer is formed on the insulator and the first electrode, and the second electrode is formed on the organic compound layer and in contact with the third electrode, and
   wherein a portion where a wiring comprising a same material as the third electrode or the second electrode is connected with a wiring extended from a terminal is formed between the terminal portion and the pixel portion.

2. A light emitting device according to claim 1, wherein the third electrode has a pattern shape identical to that of the insulator.

3. A light emitting device according to claim 1, wherein the third electrode has a pattern shape different from that of the insulator.

4. A light emitting device comprising:
   a pixel portion having a plurality of tight emitting elements, each including a first electrode electrically connected to a thin film transistor, an organic compound layer formed on the first electrode, and a second electrode formed on the organic compound layer;

a driver circuit; and a terminal portion, wherein an end portion of the first electrode is covered with an insulator, the organic compound layer is formed on the first electrode and a part of the insulator, the second electrode is formed on the organic compound layer, and a third electrode is formed on a region of the second electrode which is not overlapped with the first electrode, and wherein a portion where a wiring comprising a same material as the third electrode or the second electrode is connected with a wiring extended from a terminal is formed between the terminal portion and the pixel portion.

5. A light emitting device according to any one of claims 1 and 4, wherein the second electrode is a cathode or an anode of the light emitting element.

6. A light emitting device according to any one of claims 1 and 4, wherein the third electrode comprises at least one selected from the group consisting of poly-Si doped with an impurity element imparting a conductivity type, W, $WSi_x$, Al, Ti, Mo, Cu, Ta, Cr, and Mo, a film mainly containing an alloy material or a compound material mainly containing thereof, or a laminate film thereof.

7. A light emitting device according to any one of claims 1 and 4, wherein the first electrode is a cathode or an anode of the light emitting element.

8. A light emitting device according to any one of claims 1 and 4, wherein the insulator is a barrier comprising an organic resin covered with an inorganic insulating film.

9. A light emitting device according to any one of claims 1 and 4, wherein the insulator is an inorganic insulating film.

10. A light emitting device according to any one of claims 1 and 4, wherein the third electrode comprises a laminate having a nitride layer or a fluoride layer as an uppermost layer.

11. A light emitting device according to any one of claims 1 and 4, wherein the inorganic insulating film comprises silicon nitride.

12. A light emitting device according to any one of claims 1 and 4, wherein the light emitting device has a color filter corresponding to each of pixels composed of the light emitting element.

13. A light emitting device comprising:

a light emitting element over a substrate having an insulating surface, the light emitting element including an anode, a cathode, and an organic compound layer interposed between the anode and the cathode, wherein the light emitting element is covered with a film containing hydrogen.

14. A light emitting device comprising:

a light emitting element over a substrate having an insulating surface, the light emitting element including an anode, a cathode, and an organic compound layer interposed between the anode and the cathode, wherein the light emitting element is covered with a film containing hydrogen, and wherein the film containing hydrogen is covered with a protective film comprising an inorganic insulating film.

15. A light emitting device comprising:

a light omitting element over a substrate having an insulating surface, the light emitting element including an anode, a cathode, and an organic compound layer interposed between the anode and the cathode, wherein the light emitting element is sealed with a substrate having a light-transmissive property and a sealing member, and wherein a sealed space contains hydrogen.

16. A light emitting device according to claim 15, wherein the light emitting element is covered with the film containing hydrogen.

17. A light emitting device according to any one of claims 13 to 15, wherein the film containing hydrogen comprises carbon or a silicon nitride film.

18. A light emitting device according to any one of claims 1, 4, and 13 to 15, wherein the light emitting device is incorporated in at least one selected from the group consisting of a personal computer, a video camera, a mobile computer, a goggle type display, a player using a recording medium, a digital camera, a portable telephone, an electronic book, and a car navigation system.

* * * * *